(12) United States Patent
Kato et al.

(10) Patent No.: US 10,217,736 B2
(45) Date of Patent: Feb. 26, 2019

(54) SEMICONDUCTOR DEVICE INCLUDING TRANSISTOR AND CAPACITOR

(71) Applicant: SEMICONDUCTOR ENERGY LABORATORY CO., LTD., Atsugi-shi, Kanagawa-ken (JP)

(72) Inventors: Kiyoshi Kato, Kanagawa (JP); Hidekazu Miyairi, Kanagawa (JP); Shuhei Nagatsuka, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/492,412

(22) Filed: Sep. 22, 2014

(65) Prior Publication Data
US 2015/0084046 A1    Mar. 26, 2015

(30) Foreign Application Priority Data
Sep. 23, 2013    (JP) .................................. 2013-196335

(51) Int. Cl.
*H01L 27/06*    (2006.01)
*H01L 27/12*    (2006.01)
(Continued)

(52) U.S. Cl.
CPC ...... *H01L 27/0629* (2013.01); *H01L 27/0688* (2013.01); *H01L 27/1218* (2013.01);
(Continued)

(58) Field of Classification Search
CPC ............. H01L 27/0629; H01L 27/0688; H01L 27/1255; H01L 29/24
(Continued)

(56) References Cited

U.S. PATENT DOCUMENTS 4,466,081 A    8/1984 Masuoka
4,902,637 A    2/1990 Kondou et al.
(Continued)

FOREIGN PATENT DOCUMENTS

EP    1737044 A    12/2006
EP    2226847 A    9/2010
(Continued)

OTHER PUBLICATIONS

Kim.W et al., "An Experimental High-Density DRAM Cell with a Built-in Gain Stage", IEEE Journal of Solid-State Circuits, Aug. 1, 1994, vol. 29, No. 8, pp. 978-981.
(Continued)

*Primary Examiner* — Robert T Huber
(74) *Attorney, Agent, or Firm* — Fish & Richardson P.C.

(57) ABSTRACT

A highly integrated semiconductor device including a transistor and a capacitor which occupies a small area for the required on-state current and required capacitance is provided. The semiconductor device includes a semiconductor, first and second conductive films each in contact with top and side surfaces of the semiconductor, a first insulating film in contact with the top and side surfaces of the semiconductor, a third conductive film facing the top and side surfaces of the semiconductor with the first insulating film therebetween, a second insulating film which is in contact with the first conductive film and comprises an opening, a fourth conductive film in contact with the opening, a third insulating film facing the opening with the fourth conductive film therebetween, and a fifth conductive film facing the fourth conductive film with the third insulating film therebetween.

28 Claims, 21 Drawing Sheets

(51) Int. Cl.
*H01L 27/108* (2006.01)
*H01L 27/1156* (2017.01)

(52) U.S. Cl.
CPC ...... *H01L 27/1225* (2013.01); *H01L 27/1255* (2013.01); *H01L 27/108* (2013.01); *H01L 27/1156* (2013.01)

(58) Field of Classification Search
USPC .................. 257/43, 296, E27.113, E29.296
See application file for complete search history.

(56) References Cited

U.S. PATENT DOCUMENTS

| | | | |
|---|---|---|---|
| 5,112,765 A | 5/1992 | Cederbaum et al. |
| 5,349,366 A | 9/1994 | Yamazaki et al. |
| 5,366,922 A | 11/1994 | Aoki et al. |
| 5,731,856 A | 3/1998 | Kim et al. |
| 5,744,864 A | 4/1998 | Cillessen et al. |
| 5,796,650 A | 8/1998 | Wik et al. |
| 5,812,231 A | 9/1998 | Kochi et al. |
| 5,851,866 A | 12/1998 | Son |
| 5,936,881 A | 8/1999 | Kawashima et al. |
| 6,127,702 A | 10/2000 | Yamazaki et al. |
| 6,266,269 B1 | 7/2001 | Karp et al. |
| 6,294,274 B1 | 9/2001 | Kawazoe et al. |
| 6,314,017 B1 | 11/2001 | Emori et al. |
| 6,445,026 B1 | 9/2002 | Kubota et al. |
| 6,476,432 B1* | 11/2002 | Basceri ............ H01L 27/10808 257/296 |
| 6,515,511 B2 | 2/2003 | Sugibayashi et al. |
| 6,563,174 B2 | 5/2003 | Kawasaki et al. |
| 6,628,551 B2 | 9/2003 | Jain |
| 6,717,180 B2 | 4/2004 | Yamazaki et al. |
| 6,727,522 B1 | 4/2004 | Kawasaki et al. |
| 6,808,971 B2 | 10/2004 | Bhattacharyya |
| 6,828,584 B2 | 12/2004 | Arao et al. |
| 6,933,201 B2 | 8/2005 | Tominari et al. |
| 6,989,569 B1 | 1/2006 | Hiramoto et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,339,235 B1 | 3/2008 | Yamazaki et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,468,901 B2 | 12/2008 | Kameshiro et al. |
| 7,483,013 B2 | 1/2009 | Osame |
| 7,501,293 B2 | 3/2009 | Ito et al. |
| 7,601,984 B2 | 10/2009 | Sano et al. |
| 7,674,650 B2 | 3/2010 | Akimoto et al. |
| 7,687,331 B2 | 3/2010 | Kim et al. |
| 7,732,819 B2 | 6/2010 | Akimoto et al. |
| 7,741,644 B2 | 6/2010 | Lyu et al. |
| 7,791,072 B2 | 9/2010 | Kumomi et al. |
| 7,791,074 B2 | 9/2010 | Iwasaki |
| 7,910,490 B2 | 3/2011 | Akimoto et al. |
| 7,932,521 B2 | 4/2011 | Akimoto et al. |
| 7,935,582 B2 | 5/2011 | Iwasaki |
| 7,956,361 B2 | 6/2011 | Iwasaki |
| 7,994,500 B2 | 8/2011 | Kim et al. |
| 8,058,645 B2 | 11/2011 | Jeong et al. |
| 8,084,331 B2 | 12/2011 | Ofuji et al. |
| 8,134,156 B2 | 3/2012 | Akimoto |
| 8,148,779 B2 | 4/2012 | Jeong et al. |
| 8,154,024 B2 | 4/2012 | Iwasaki |
| 8,158,464 B2 | 4/2012 | Akimoto |
| 8,188,480 B2 | 5/2012 | Itai |
| 8,202,365 B2 | 6/2012 | Umeda et al. |
| 8,203,143 B2 | 6/2012 | Imai |
| 8,203,146 B2 | 6/2012 | Abe et al. |
| 8,217,435 B2 | 7/2012 | Chang et al. |
| 8,237,166 B2 | 8/2012 | Kumomi et al. |
| 8,274,077 B2 | 9/2012 | Akimoto et al. |
| 8,339,828 B2 | 12/2012 | Yamazaki et al. |
| 8,368,079 B2 | 2/2013 | Akimoto |
| 8,378,341 B2 | 2/2013 | Hayashi et al. |
| 8,389,417 B2 | 3/2013 | Yamazaki et al. |
| 8,400,817 B2 | 3/2013 | Yamazaki et al. |
| 8,450,783 B2 | 5/2013 | Yamazaki et al. |
| 8,455,868 B2 | 6/2013 | Yamazaki et al. |
| 8,466,463 B2 | 6/2013 | Akimoto et al. |
| 8,482,001 B2 | 7/2013 | Yamazaki et al. |
| 8,525,165 B2 | 9/2013 | Akimoto |
| 8,547,771 B2 | 10/2013 | Koyama |
| 8,559,220 B2 | 10/2013 | Yamazaki et al. |
| 8,569,812 B2 | 10/2013 | Chang et al. |
| 8,629,069 B2 | 1/2014 | Akimoto et al. |
| 8,669,550 B2 | 3/2014 | Akimoto et al. |
| 8,742,412 B2 | 6/2014 | Goyal et al. |
| 8,754,409 B2 | 6/2014 | Yamazaki et al. |
| 9,006,736 B2 | 4/2015 | Sasagawa et al. |
| 9,214,474 B2 | 12/2015 | Yamazaki |
| 9,287,405 B2 | 3/2016 | Sasagawa et al. |
| 9,287,408 B2 | 3/2016 | Yamazaki et al. |
| 9,548,395 B2 | 1/2017 | Yamazaki et al. |
| 9,698,275 B2 | 7/2017 | Yamazaki |
| 9,728,648 B2 | 8/2017 | Sasagawa et al. |
| 9,859,268 B2 | 1/2018 | Matsubayashi |
| 9,859,443 B2 | 1/2018 | Yamazaki et al. |
| 2001/0015450 A1 | 8/2001 | Sugibayashi et al. |
| 2001/0046027 A1 | 11/2001 | Tai et al. |
| 2002/0056838 A1 | 5/2002 | Ogawa |
| 2002/0096702 A1 | 7/2002 | Ishii et al. |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2005/0237786 A1 | 10/2005 | Atwood et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0262483 A1 | 11/2006 | Osame |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1* | 3/2007 | Yabuta ................ H01L 29/7869 257/347 |
| 2007/0054507 A1 | 3/2007 | Kaji et al. |
| 2007/0063287 A1 | 3/2007 | Sano et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |

(56) References Cited

U.S. PATENT DOCUMENTS

| | | |
|---|---|---|
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0149984 A1 | 6/2008 | Chang et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296567 A1 | 12/2008 | Irving et al. |
| 2008/0296568 A1 | 12/2008 | Ryu et al. |
| 2008/0308805 A1 | 12/2008 | Akimoto et al. |
| 2009/0002590 A1 | 1/2009 | Kimura |
| 2009/0045397 A1 | 2/2009 | Iwasaki |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0114918 A1 | 5/2009 | Wang et al. |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0186445 A1 | 7/2009 | Akimoto |
| 2009/0189153 A1 | 7/2009 | Iwasaki et al. |
| 2009/0189155 A1 | 7/2009 | Akimoto |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2010/0003783 A1 | 1/2010 | Akimoto |
| 2010/0065844 A1 | 3/2010 | Tokunaga |
| 2010/0092800 A1 | 4/2010 | Itagaki et al. |
| 2010/0097838 A1 | 4/2010 | Tanaka et al. |
| 2010/0109002 A1 | 5/2010 | Itagaki et al. |
| 2010/0136743 A1 | 6/2010 | Akimoto et al. |
| 2010/0148171 A1 | 6/2010 | Hayashi et al. |
| 2010/0193785 A1 | 8/2010 | Kimura |
| 2010/0203673 A1 | 8/2010 | Hayashi et al. |
| 2010/0276689 A1 | 11/2010 | Iwasaki |
| 2010/0279462 A1 | 11/2010 | Iwasaki |
| 2010/0295042 A1 | 11/2010 | Yano et al. |
| 2010/0320458 A1 | 12/2010 | Umeda et al. |
| 2010/0320459 A1 | 12/2010 | Umeda et al. |
| 2011/0089417 A1 | 4/2011 | Yamazaki et al. |
| 2011/0089419 A1 | 4/2011 | Yamazaki et al. |
| 2011/0101332 A1 | 5/2011 | Yamazaki et al. |
| 2011/0101334 A1 | 5/2011 | Yamazaki et al. |
| 2011/0101339 A1 | 5/2011 | Yamazaki et al. |
| 2011/0101351 A1 | 5/2011 | Yamazaki |
| 2011/0104851 A1 | 5/2011 | Akimoto et al. |
| 2011/0110145 A1 | 5/2011 | Yamazaki et al. |
| 2011/0117697 A1 | 5/2011 | Akimoto et al. |
| 2011/0121290 A1 | 5/2011 | Akimoto et al. |
| 2011/0122673 A1 | 5/2011 | Kamata et al. |
| 2011/0134683 A1 | 6/2011 | Yamazaki et al. |
| 2011/0193083 A1 | 8/2011 | Kim et al. |
| 2011/0215328 A1 | 9/2011 | Morosawa et al. |
| 2012/0119205 A1* | 5/2012 | Taniguchi ......... H01L 29/78693 257/43 |
| 2012/0161220 A1 | 6/2012 | Yamazaki |
| 2012/0267624 A1* | 10/2012 | Isobe ................. H01L 27/0688 257/43 |
| 2013/0187150 A1* | 7/2013 | Yamazaki ......... H01L 29/78696 257/43 |
| 2014/0015021 A1 | 1/2014 | Chang et al. |
| 2014/0339549 A1 | 11/2014 | Yamazaki et al. |
| 2014/0361293 A1 | 12/2014 | Yamazaki et al. |
| 2015/0084047 A1 | 3/2015 | Yamazaki |
| 2017/0358685 A1 | 12/2017 | Sasagawa et al. |

FOREIGN PATENT DOCUMENTS

| | | |
|---|---|---|
| JP | 47-016085 A | 8/1972 |
| JP | 57-105889 A | 7/1982 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 63-268184 A | 11/1988 |
| JP | 05-251705 A | 9/1993 |
| JP | 08-264794 A | 10/1996 |
| JP | 11-505377 | 5/1999 |
| JP | 11-233789 A | 8/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2002-368226 A | 12/2002 |
| JP | 2003-086000 A | 3/2003 |
| JP | 2003-086808 A | 3/2003 |
| JP | 2003-101407 A | 4/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| JP | 2006-165532 A | 6/2006 |
| JP | 2007-122758 A | 5/2007 |
| JP | 2008-277665 A | 11/2008 |
| JP | 2009-135350 A | 6/2009 |
| JP | 2010-177431 A | 8/2010 |
| JP | 2012-059860 A | 3/2012 |
| JP | 2012-160679 A | 8/2012 |
| JP | 2012-216802 A | 11/2012 |
| JP | 2012-256411 A | 12/2012 |
| JP | 2012-257187 A | 12/2012 |
| JP | 2013-038400 A | 2/2013 |
| JP | 2013-102141 A | 5/2013 |
| JP | 2013-168646 A | 8/2013 |
| WO | WO-2004/114391 | 12/2004 |
| WO | WO-2009/093625 | 7/2009 |

OTHER PUBLICATIONS

Shukuri.S et al., "A Complementary Gain Cell Technology for sub-1 V Supply DRAMs", IEDM 92: Technical Digest of International Electron Devices Meeting, Dec. 13, 1992, pp. 1006-1008.

Shukuri.S et al., "A Semi-Static Complementary Gain Cell Technology for Sub-1 V Supply DRAM's", IEEE Transactions on Electron Devices, Jun. 1, 1994, vol. 14, No. 6, pp. 926-931.

Kim.M et al., "High mobility bottom gate InGaZnO thin film transistors with SiOx etch stopper", Appl. Phys. Lett. (Applied Physics Letters), May 24, 2007, vol. 90, No. 21, pp. 212114-1-212114-3.

Nakayama et al., "17a-TL-8 Effect of GaO Layer on IGZO-TFT Channel", Extended Abstracts (The 57th Spring Meeting 2010), The Japan Society of Applied Physics and Related Societies, Mar. 17, 2010, pp. 21-21008.

Kameshiro.N et al., "A Fully Logic-Process-Compatible, 3-Transistor, SESO-memory Cell Featuring 0.1-FIT/Mb Soft Error, 100-MHz Random Cycle, and 100-ms Retention", 2008 Symposium on VLSI Circuits Digest of Technical Papers, Aug. 1, 2008, pp. 122-123.

Ishii.T et al., "A Poly-Silicon TFT With a Sub-5-nm Thick Channel for Low-Power Gain Cell Memory in Mobile Applications", IEEE Transactions on Electron Devices, Nov. 1, 2004, vol. 51, No. 11, pp. 1805-1810.

(56) References Cited

OTHER PUBLICATIONS

Hosono.H et al., "Achievement of High-Performance Transparent Transistor"—Using Transparent Oxide Semiconductor: InGaO3(ZnO)5 Film-, Japan Science and Technology Corporation Report, May 23, 2003, vol. 320.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devies, Jul. 1, 1995, vol. 42, No. 7, pp. 1240-1246.

Cho.D et al., "21.2:Al and Sn-Doped Zinc Indium Oxide Thin Film Transistors for AMOLED Back Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review, A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMo3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

(56) References Cited

OTHER PUBLICATIONS

Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.
Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B (Physical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of the Electrochemical Society), 2008, Vol. 155, No. 12, pp. H1009-H1014.
Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Ohara.H et al., "Amorphous In—Ga—Zn-Oxide TFTs with Suppressed Variation for 4.0 Inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide InGaO3(ZnO)m (m<4):a Zn4s conductor", Philosophical Magazine, 2001, vol. 81, No. 5, pp. 501-515.
Orita.M et al., "Mechanism of Electrical Conductivity of Transparent InGaZnO4", Phys. Rev B (Physical Review. B), Jan. 15, 2000, vol. 61, No. 3, pp. 1811-1816.
Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.
Park.S et al., "Challenge to Future Displays: Transparent AM-OLED Driven by PEALD Grown ZnO TFT", IMID '07 Digest, 2007, pp. 1249-1252.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters), Jun. 17, 1996, vol. 68, No. 25, pp. 3650-3652.
Sakata.J et al., "Development of 4.0-In. AMOLED Display With Driver Circuit Using Amorphous In—Ga≥Zn-Oxide TFTS", IDW '09 : Proceedings of the 16th International Display Workshops, 2009, pp. 689-692.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest of Technical Papers, May 20, 2008, vol. 39, pp. 633-636.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Tsuda.K et al., "Ultra Low Power Consumption Technologies for Mobile TFT-LCDs", IDW '02 : Proceedings of the 9th International Display Workshops, Dec. 4, 2002, pp. 295-298.
Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner 50　51　107　　　　107　51

50　51　　　　　51
109　107　　　107

52

52

CAAC-OS nc-OS

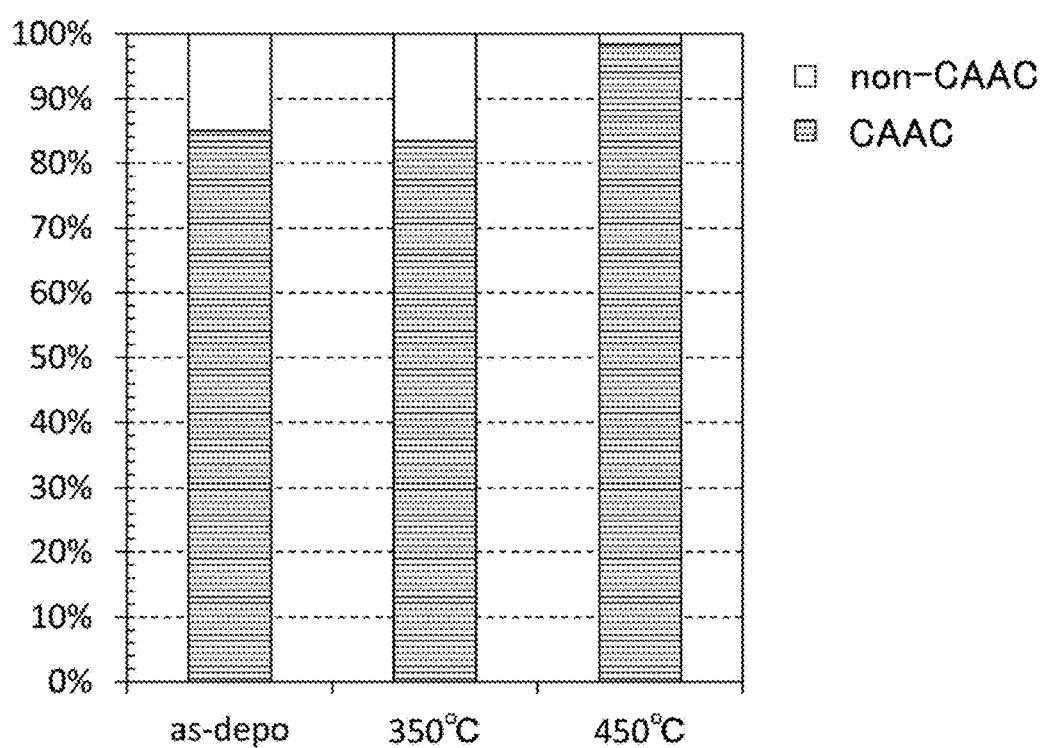

SEMICONDUCTOR DEVICE INCLUDING TRANSISTOR AND CAPACITOR

BACKGROUND OF THE INVENTION

1. Field of the Invention

The present invention relates to an object, a method, or a manufacturing method. Furthermore, the present invention relates to a process, a machine, manufacture, or a composition of matter. One embodiment of the present invention relates to a semiconductor device, a display device, a light-emitting device, a lighting device, a power storage device, a memory device, or a processor; a method for manufacturing a semiconductor film, a semiconductor device, a display device, a light-emitting device, a lighting device, a power storage device, a memory device, or a processor; a method for driving a semiconductor device, a display device, a light-emitting device, a lighting device, a power storage device, a memory device, or a processor. In particular, one embodiment of the present invention relates to a semiconductor device, a display device, or a light-emitting device each including an oxide semiconductor.

In this specification and the like, a semiconductor device generally means a device that can function by utilizing semiconductor characteristics. A display device, a light-emitting device, a lighting device, an electro-optical device, a semiconductor circuit, and an electronic device include a semiconductor device in some cases.

2. Description of the Related Art

As silicon which is used as a semiconductor of a transistor, either amorphous silicon or polycrystalline silicon is used depending on the purpose. For example, in the case of a transistor included in a large-sized display device, it is preferred to use amorphous silicon, which can be formed using the established technique for forming a film on a large-sized substrate. On the other hand, in the case of a transistor included in a high-performance display device where driver circuits are formed over the same substrate, it is preferred to use polycrystalline silicon, which can form a transistor having high field-effect mobility. As a method for forming polycrystalline silicon, high-temperature heat treatment or laser light treatment which is performed on amorphous silicon has been known.

In recent years, an oxide semiconductor has attracted attention. For example, a transistor which includes an amorphous oxide semiconductor containing indium, gallium, and zinc is disclosed (see Patent Document 1).

An oxide semiconductor can be formed by a sputtering method or the like, and thus can be used for a channel formation region of a transistor in a large display device. A transistor including an oxide semiconductor has high field-effect mobility; therefore, a high-performance display device where driver circuits are formed over the same substrate can be obtained. In addition, there is an advantage that capital investment can be reduced because part of production equipment for a transistor including amorphous silicon can be retrofitted and utilized.

A transistor including an oxide semiconductor is known to have extremely small leakage current in an off state. For example, a CPU or the like with low-power consumption utilizing the leakage current of the transistor including an oxide semiconductor is disclosed (see Patent Document 2).

Patent Document 3 discloses that a transistor having high field-effect mobility can be obtained by a well potential formed using an active layer formed of a semiconductor.

REFERENCE

Patent Document

[Patent Document 1] Japanese Published Patent Application No. 2006-165528
[Patent Document 2] Japanese Published Patent Application No. 2012-257187
[Patent Document 3] Japanese Published Patent Application No. 2012-59860

SUMMARY OF THE INVENTION

An object is to provide a semiconductor device including a transistor and a capacitor. Another object is to provide a semiconductor device in which an area occupied by a capacitor is small. Another object is to provide a semiconductor device in which an area occupied by a transistor is small. Another object is to provide a highly integrated semiconductor device.

Another object is to provide a memory element which occupies a small area. Another object is to provide a highly integrated memory device. Another object is to provide a processor including the memory element or the memory device.

Another object is to provide a transistor having high field-effect mobility. Another object is to provide a transistor having stable electrical characteristics. Another object is to provide a transistor having small off-state current (current in an off state). Another object is to provide a semiconductor device including any of the transistors. Another object is to provide a novel semiconductor device.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a semiconductor device including a semiconductor, a first conductive film and a second conductive film each including a region in contact with a top surface and a side surface of the semiconductor, a first insulating film including a region in contact with the top surface and the side surface of the semiconductor, a third conductive film including a region facing the top surface and the side surface of the semiconductor with the first insulating film therebetween, a second insulating film which is in contact with the first conductive film and includes an opening reaching the first conductive film, a fourth conductive film including a region in contact with a bottom surface and a side surface of the opening, a third insulating film including a region facing the bottom surface and the side surface of the opening with the fourth conductive film therebetween, and a fifth conductive film including a region facing the fourth conductive film with the third insulating film therebetween.

Another embodiment of the present invention is a semiconductor device including a semiconductor substrate, a first transistor using the semiconductor substrate, a second transistor including a region overlapping with at least part of the first transistor, and a capacitor. The second transistor includes a semiconductor, a first conductive film and a second conductive film each including a region in contact with a top surface and a side surface of the semiconductor, a first insulating film including a region in contact with the top surface and the side surface of the semiconductor, and a third conductive film including a region facing the top surface and the side surface of the semiconductor with the first insulating film therebetween. The capacitor includes a second insulating film which is in contact with the first conductive film and includes an opening reaching the first conductive film, a fourth conductive film including a region in contact with a bottom surface and a side surface of the opening, a third insulating film including a region facing the bottom surface and the side surface of the opening with the fourth conductive film therebetween, and a fifth conductive film including a region facing the fourth conductive film with the third insulating film therebetween.

Another embodiment of the present invention is a semiconductor device including a first transistor, a second transistor, and a capacitor. The first transistor is electrically connected to the second transistor. The second transistor includes a semiconductor, a first conductive film and a second conductive film each including a region in contact with a top surface and a side surface of the semiconductor, a first insulating film including a region in contact with the top surface and the side surface of the semiconductor, and a third conductive film including a region facing the top surface and the side surface of the semiconductor with the first insulating film therebetween. The capacitor includes a second insulating film which is in contact with the first conductive film and includes an opening reaching the first conductive film, a fourth conductive film including a region in contact with a bottom surface and a side surface of the opening, a third insulating film including a region facing the bottom surface and the side surface of the opening with the fourth conductive film therebetween, and a fifth conductive film including a region facing the fourth conductive film with the third insulating film therebetween.

Another embodiment of the present invention is a semiconductor device including a semiconductor, a first conductive film and a second conductive film each including a region in contact with a top surface and a side surface of the semiconductor, a first insulating film including a region in contact with the top surface and the side surface of the semiconductor, a third conductive film including a region facing the top surface and the side surface of the semiconductor with the first insulating film therebetween, a second insulating film in contact with the first conductive film, a fourth conductive film over the second insulating film, a third insulating film over the second insulating film, a fifth conductive film which is over the third insulating film and electrically connected to the first conductive film through the fourth conductive film, a fourth insulating film in contact with the fifth conductive film, and a sixth conductive film facing the fifth conductive film with the fourth insulating film therebetween.

Another embodiment of the present invention is a semiconductor device including a semiconductor substrate, a first transistor using the semiconductor substrate, a second transistor overlapping with at least part of the first transistor, and a capacitor overlapping with at least part of the first transistor or the second transistor. The second transistor includes a semiconductor, a first conductive film and a second conductive film each including a region in contact with a top surface and a side surface of the semiconductor, a first insulating film including a region in contact with the top surface and the side surface of the semiconductor, and a third conductive film including a region facing the top surface and the side surface of the semiconductor with the first insulating film therebetween. The capacitor includes a second insulating film which is in contact with the first conductive film and includes an opening reaching the first conductive film, a fourth conductive film including a region in contact with a bottom surface and a side surface of the opening, a third insulating film including a region facing the bottom surface and the side surface of the opening with the fourth conductive film therebetween, and a fifth conductive film including a region facing the fourth conductive film with the third insulating film therebetween.

Another embodiment of the present invention is a semiconductor device including a first transistor, a second transistor, and a capacitor. The first transistor is electrically connected to the second transistor. The second transistor includes a semiconductor, a first conductive film and a second conductive film each including a region in contact with a top surface and a side surface of the semiconductor, a first insulating film including a region in contact with the top surface and the side surface of the semiconductor, and a third conductive film including a region facing the top surface and the side surface of the semiconductor with the first insulating film therebetween. The capacitor includes a second insulating film which is in contact with the first conductive film and includes an opening reaching the first conductive film, a fourth conductive film including a region in contact with a bottom surface and a side surface of the opening, a third insulating film including a region facing the bottom surface and the side surface of the opening with the fourth conductive film therebetween, and a fifth conductive film including a region facing the fourth conductive film with the third insulating film therebetween.

In the semiconductor device of any of the above embodiments, the semiconductor is a multilayer film including a first oxide semiconductor layer and a second oxide semiconductor layer having a higher electron affinity than the first oxide semiconductor layer.

In the above semiconductor device, a third oxide semiconductor layer having a lower electron affinity than the second oxide semiconductor layer is provided between the semiconductor and the first insulating film.

A semiconductor device including a transistor and a capacitor can be provided. A semiconductor device in which an area occupied by a capacitor is small can be provided. A semiconductor device in which an area occupied by a transistor is small can be provided. A highly integrated semiconductor device can be provided.

A memory element which occupies a small area can be provided. A highly integrated memory device can be provided. A processor including the memory element or the memory device can be provided.

A transistor having high field-effect mobility can be provided. A transistor having stable electrical characteristics can be provided. A transistor having small off-state current can be provided. A semiconductor device including any of the transistors can be provided. A novel semiconductor device can be provided. Note that the description of these effects does not disturb the existence of other effects. In one embodiment of the present invention, there is no need to obtain all the effects. Other effects will be apparent from and can be derived from the description of the specification, the drawings, the claims, and the like.

BRIEF DESCRIPTION OF THE DRAWINGS

In the accompanying drawings:

FIG. 21 illustrates an example of a structure analysis by transmission electron diffraction measurement.

DETAILED DESCRIPTION OF THE INVENTION

Figure 1A:
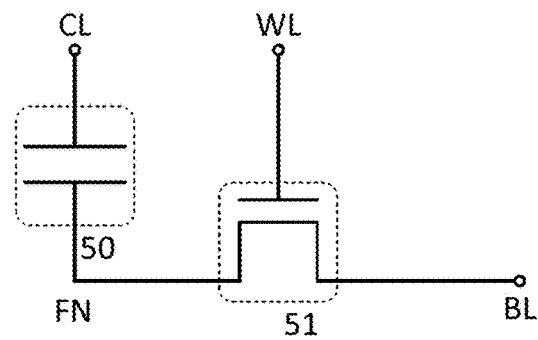
FIGS. 1A to 1C are a circuit diagram and cross-sectional views illustrating an example of a semiconductor device of one embodiment of the present invention.

Hereinafter, embodiments of the present invention will be described in detail with reference to the drawings. However, the present invention is not limited to the description below, and it is easily understood by those skilled in the art that modes and details disclosed herein can be modified in various ways. Therefore, the present invention is not construed as being limited to description of the embodiments. In describing structures of the present invention with reference to the drawings, common reference numerals are used for the same portions in different drawings. Note that the same hatched pattern is applied to similar parts, and the similar parts are not especially denoted by reference numerals in some cases.

Note that the size, the thickness of films (layers), or regions in drawings is sometimes exaggerated for simplicity.

A voltage usually refers to a potential difference between a given potential and a reference potential (e.g., a source potential or a ground potential (GND)). A voltage can be referred to as a potential.

Note that the ordinal numbers such as "first" and "second" in this specification are used for convenience and do not denote the order of steps or the stacking order of layers. Therefore, for example, description can be made even when "first" is replaced with "second", "third", or the like as appropriate. In addition, the ordinal numbers in this specification and the like are not necessarily the same as the ordinal numbers used to specify one embodiment of the present invention.

Note that a "semiconductor" includes characteristics of an "insulator" in some cases when the conductivity is sufficiently low, for example. Furthermore, a "semiconductor" and an "insulator" cannot be strictly distinguished from each other in some cases because a border between the "semiconductor" and the "insulator" is not clear. Accordingly, a "semiconductor" in this specification can be called an "insulator" in some cases. Similarly, an "insulator" in this specification can be called a "semiconductor" in some cases.

Furthermore, a "semiconductor" includes characteristics of a "conductor" in some cases when the conductivity is sufficiently high, for example. Furthermore, a "semiconductor" and a "conductor" cannot be strictly distinguished from each other in some cases because a border between the "semiconductor" and the "conductor" is not clear. Accordingly, a "semiconductor" in this specification can be called a "conductor" in some cases. Similarly, a "conductor" in this specification can be called a "semiconductor" in some cases.

Note that an impurity in a semiconductor refers to, for example, elements other than the main components of a semiconductor. For example, an element with a concentration of lower than 0.1 atomic % is an impurity. When an impurity is contained, the density of states (DOS) in a semiconductor may be increased, the carrier mobility may be decreased, or the crystallinity may be decreased, for example. When the semiconductor is an oxide semiconductor, examples of an impurity which changes the characteristics of the semiconductor include Group 1 elements, Group 2 elements, Group 14 elements, Group 15 elements, and transition metals other than the main components; specifically, there are hydrogen (including water), lithium, sodium, silicon, boron, phosphorus, carbon, and nitrogen, for example. When the semiconductor is an oxide semiconductor, oxygen vacancies may be formed by entry of impurities such as hydrogen, for example. Furthermore, when the semiconductor is silicon, examples of an impurity which changes the characteristics of the semiconductor include oxygen, Group 1 elements except hydrogen, Group 2 elements, Group 13 elements, and Group 15 elements.

<Semiconductor Device>

An example of a semiconductor device of one embodiment of the present invention is shown below.

<Structure Example 1 of Semiconductor Device>

FIG. 1A is an example of a circuit diagram of a semiconductor device of one embodiment of the present invention.

The semiconductor device in FIG. 1A includes a capacitor 50, a transistor 51, a wiring BL, a wiring WL, and a wiring CL.

One of a source and a drain of the transistor 51 is electrically connected to the wiring BL, the other of the source and the drain thereof is electrically connected to one of electrodes of the capacitor 50, and a gate thereof is electrically connected to the wiring WL. The other of electrodes of the capacitor 50 is electrically connected to the wiring CL. Note that a node between the other of the source and the drain of the transistor 51 and the one of electrodes of the capacitor 50 is referred to as a node FN.

Accordingly, in the semiconductor device in FIG. 1A, a potential based on a potential of the wiring BL is supplied to the node FN at the time when the transistor 51 is in a conduction state (on state). Further, the semiconductor device has a function of holding a potential of the node FN at the time when the transistor 51 is in a non-conduction state (off state). In other words, the semiconductor device in FIG. 1A has a function of a memory cell of a memory device. In the case where a display element such as a liquid crystal element or an organic electroluminescence (EL) element is electrically connected to the node FN, the semiconductor device in FIG. 1A can function as a pixel of a display device.

Conduction and non-conduction states of the transistor 51 can be controlled by a potential supplied to the wiring WL. A transistor with small off-state current is used as the transistor 51, whereby the potential of the node FN at the time when the transistor 51 is in a non-conduction state can be held for a long time. Therefore, the frequency of refresh operations of the semiconductor device can be reduced, and power consumption of the semiconductor device can be reduced. A transistor including an oxide semiconductor is given as an example of a transistor with small off-state current.

A constant potential such as a ground potential is supplied to the wiring CL.

The semiconductor devices of FIG. 1A are arranged in a matrix, so that a memory device (memory cell array) or a display device (pixel array) can be formed.

Figure 1B:
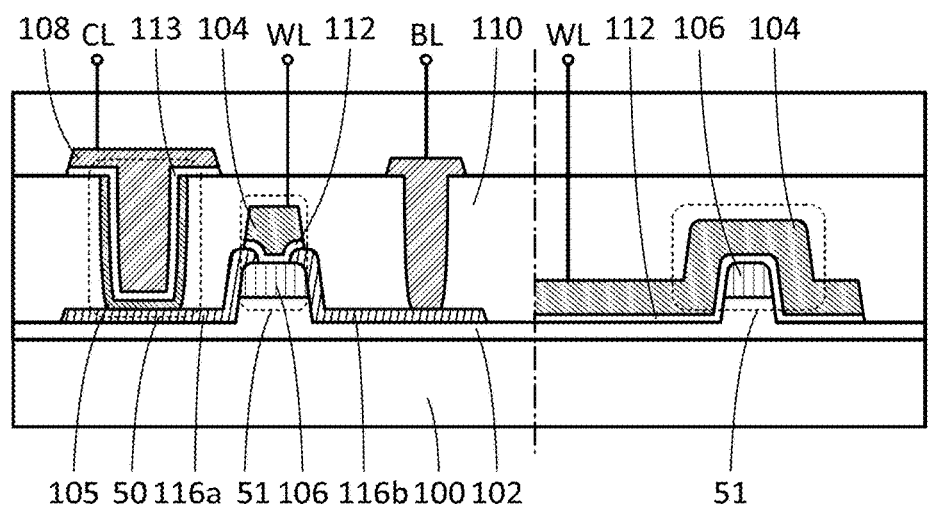

FIG. 1B is an example of a cross-sectional view corresponding to the semiconductor device in FIG. 1A.

The semiconductor device in FIG. 1B includes the transistor 51 and the capacitor 50 over a substrate 100. Note that on the left side of a dashed-dotted line is a cross-sectional view in the channel length direction (also referred to as a longitudinal direction or a long-side direction) of the transistor 51, and on the right side of the dashed-dotted line is a cross-sectional view in the channel width direction (also referred to as a lateral direction or a short-side direction) of the transistor 51.

The transistor 51 in FIG. 1B includes an insulating film 102 having a projection over the substrate 100, a semiconductor 106 over the projection of the insulating film 102, a conductive film 116*a* and a conductive film 116*b* each including a region in contact with a top surface and a side surface of the semiconductor 106, an insulating film 112 over the semiconductor 106, the conductive film 116*a*, and the conductive film 116*b*, and a conductive film 104 which is in contact with a top surface of the insulating film 112 and faces the top surface and the side surface of the semiconductor 106. Note that the insulating film 102 does not necessarily include a projection. The conductive film 104 serves as a gate electrode of the transistor 51. The insulating film 112 serves as a gate insulating film of the transistor 51. The conductive film 116*a* and the conductive film 116*b* serve as a source electrode and a drain electrode of the transistor 51.

In the cross-sectional view in the channel width direction of the transistor 51, the height (thickness) of the semiconductor 106 is 0.8 or more times, preferably 1 or more times, more preferably 1.2 or more times, still more preferably 1.5 or more times the horizontal width (width) of the semiconductor 106. When the height of the semiconductor 106 is in the above range, the amount of drain current flowing in the side surface of the semiconductor 106 can be larger than the amount of drain current flowing in the top surface of the semiconductor 106 at the time when the transistor 51 is on. Therefore, the transistor 51 has large on-state current for the area occupied thereby. That is, the area occupied by the transistor 51 can be small for required on-state current. Note that in the cross-sectional view in the channel width direction of the transistor 51, the horizontal width of the semiconductor 106 is preferably smaller than or equal to 40 nm, more preferably smaller than or equal to 30 nm, still more preferably smaller than or equal to 20 nm.

With the projection of the insulating film 102, the transistor 51 has a structure in which the semiconductor 106 can be electrically surrounded by an electric field of the conductive film 104 (a structure of a transistor in which a semiconductor is electrically surrounded by an electric field of a conductive film is referred to as a surrounded channel (s-channel) structure). Therefore, a channel is formed in the entire semiconductor 106 (bulk) in some cases. In the s-channel structure, the drain current of the transistor is increased, so that a larger amount of on-state current can be obtained. Furthermore, the entire channel formation region of the semiconductor 106 can be depleted by the electric field of the conductive film 104. Accordingly, off-state current of the transistor with an s-channel structure can be further reduced.

At least part (or all) of the conductive film 116*a* (and/or the conductive film 116*b*) is provided on at least part (or all) of a surface, a side surface, a top surface, and/or a bottom surface of a semiconductor, e.g., the semiconductor 106.

Alternatively, at least part (or all) of the conductive film 116*a* (and/or the conductive film 116*b*) is in contact with at least part (or all) of a surface, a side surface, a top surface, and/or a bottom surface of a semiconductor, e.g., the semiconductor 106. Further alternatively, at least part (or all) of the conductive film 116*a* (and/or the conductive film 116*b*) is in contact with at least part (or all) of a semiconductor, e.g., the semiconductor 106.

Alternatively, at least part (or all) of the conductive film 116*a* (and/or the conductive film 116*b*) is electrically connected to at least part (or all) of a surface, a side surface, a top surface, and/or a bottom surface of a semiconductor, e.g., the semiconductor 106. Alternatively, at least part (or all) of the conductive film 116*a* (and/or the conductive film 116*b*) is electrically connected to at least part (or all) of a semiconductor, e.g., the semiconductor 106.

Alternatively, at least part (or all) of the conductive film 116*a* (and/or the conductive film 116*b*) is provided near at least part (or all) of a surface, a side surface, a top surface, and/or a bottom surface of a semiconductor, e.g., the semiconductor 106. Alternatively, at least part (or all) of the conductive film 116*a* (and/or the conductive film 116*b*) is provided near at least part (or all) of a semiconductor, e.g., the semiconductor 106.

Alternatively, at least part (or all) of the conductive film 116*a* (and/or the conductive film 116*b*) is provided on a side of at least part (or all) of a surface, a side surface, a top surface, and/or a bottom surface of a semiconductor, e.g., the semiconductor 106. Alternatively, at least part (or all) of the conductive film 116*a* (and/or the conductive film 116*b*) is provided on a side of at least part (or all) of a semiconductor, e.g., the semiconductor 106.

Alternatively, at least part (or all) of the conductive film 116*a* (and/or the conductive film 116*b*) is provided obliquely above at least part (or all) of a surface, a side surface, a top surface, and/or a bottom surface of a semiconductor, e.g., the semiconductor 106. Alternatively, at least part (or all) of the conductive film 116a (and/or the conductive film 116b) is provided obliquely above at least part (or all) of a semiconductor, e.g., the semiconductor 106.

Alternatively, at least part (or all) of the conductive film 116a (and/or the conductive film 116b) is provided above at least part (or all) of a surface, a side surface, a top surface, and/or a bottom surface of a semiconductor, e.g., the semiconductor 106. Alternatively, at least part (or all) of the conductive film 116a (and/or the conductive film 116b) is provided above at least part (or all) of a semiconductor, e.g., the semiconductor 106.

The capacitor 50 in FIG. 1B includes an opening of an insulating film 110 in contact with the conductive film 116a, a conductive film 105 including a region in contact with a bottom surface and a side surface of the opening and a region in contact with the conductive film 116a, an insulating film 113 including a region facing the bottom surface and the side surface of the opening with the conductive film 105 therebetween, and a conductive film 108 facing the conductive film 105 with the insulating film 113 therebetween. The conductive film 105 serves as the one of the electrodes of the capacitor 50. The conductive film 108 serves as the other of electrodes of the capacitor 50.

The capacitor 50 is formed in the opening of the insulating film 110. Therefore, the capacitance of the capacitor 50 can be larger than the capacitance of a capacitor formed only over a flat region. In other words, the area occupied by the capacitor 50 can be small for the required capacitance. In view of an increase in capacitance, the thickness of the insulating film 110 (the depth of the opening) is preferably large. Note that the sum of the thickness of the conductive film 105 and the thickness of the insulating film 113 is made smaller than the depth and the width of the opening.

Since the semiconductor device including the transistor 51 and the capacitor 50 occupies a small area, the semiconductor device can be highly integrated.

The conductive film 116b is electrically connected to the wiring BL. The conductive film 108 is electrically connected to the wiring CL. The conductive film 104 is electrically connected to the wiring WL.

Components of the transistor 51 and the capacitor 50 are described below in detail.

There is no large limitation on the substrate 100. For example, a glass substrate, a ceramic substrate, a quartz substrate, a sapphire substrate, or a stabilized zirconia substrate (e.g., an yttria-stabilized zirconia substrate) may be used. Alternatively, a single crystal semiconductor substrate or a polycrystalline semiconductor substrate made of silicon, silicon carbide, or the like, a compound semiconductor substrate made of silicon germanium or the like, a silicon-on-insulator (SOI) substrate, or the like may be used. Still alternatively, any of these substrates provided with a semiconductor element may be used.

Still alternatively, a flexible substrate may be used as the substrate 100. As a method for providing a transistor over a flexible substrate, there is a method in which a transistor is formed over a non-flexible substrate, and then the transistor is separated and transferred to the substrate 100 which is a flexible substrate. In that case, a separation layer is preferably provided between the non-flexible substrate and the transistor.

The insulating film 102 may be formed of, for example, a single layer or a stack of an insulating film containing aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

The insulating film 102 has a function of preventing diffusion of impurities from the substrate 100. Here, in the case where the semiconductor 106 is an oxide semiconductor, the insulating film 102 can have a function of supplying oxygen to the semiconductor 106. Therefore, the insulating film 102 is preferably an insulating film containing oxygen. For example, an insulating film containing oxygen more than that in the stoichiometric composition is preferable.

The insulating film 102 may be formed by a sputtering method, a chemical vapor deposition (CVD) method, a molecular beam epitaxy (MBE) method, a pulsed laser deposition (PLD) method, or an atomic layer deposition (ALD) method.

Note that in the case where the insulating film 102 is a stacked-layer film, films in the stacked-layer film may be formed by different formation methods such as the above formation methods. For example, the first layer may be formed by a CVD method and the second layer may be formed by an ALD method. Alternatively, the first layer may be formed by a sputtering method and the second layer may be formed by an ALD method. When films are formed by different formation methods as described above, the films can have different functions or different properties. Further, by stacking the films, a more appropriate film can be formed as a stacked-layer film.

In other words, an n-th film is formed by at least one of a sputtering method, a CVD method, an MBE method, a PLD method, an ALD method, and the like, and an n+1-th film is formed by at least one of a sputtering method, a CVD method, an MBE method, a PLD method, an ALD method, and the like. Note that the n-th film and the n+1-th film may be formed by the same formation method or different formation methods (n is a natural number). Note that the n-th film and an n+2-th film may be formed by the same formation method. Alternatively, all the films may be formed by the same formation method.

Alternatively, when a silicon substrate is used as the substrate 100, the insulating film to be the insulating film 102 can be formed by a thermal oxidation method.

Then, in order to planarize the surface of the insulating film to be the insulating film 102, chemical mechanical polishing (CMP) treatment may be performed. By CMP treatment, the insulating film to be the insulating film 102 has an average surface roughness (Ra) of less than or equal to 1 nm, preferably less than or equal to 0.3 nm, more preferably less than or equal to 0.1 nm. In some cases, Ra that is less than or equal to the above value can increase the crystallinity of the semiconductor 106. Ra can be measured using an atomic force microscope (AFM).

As the semiconductor 106, a Group 14 semiconductor film such as a silicon film or a germanium film, a compound semiconductor film such as a silicon carbide film, a germanium silicide film, a gallium arsenide film, an indium phosphide film, a zinc selenide film, a cadmium sulfide film, or an oxide semiconductor film, an organic semiconductor film, or the like may be used. The semiconductor 106 may have a single-layer structure or a stacked-layer structure.

It is preferable that an oxide semiconductor be used for the semiconductor 106 because the off-state current of the transistor 51 can be reduced. Specific examples of the oxide semiconductor are mentioned later.

As a method for forming the semiconductor 106, a CVD method may be used, for example. By the CVD method, a semiconductor whose composition is continuously changed can be formed for the semiconductor 106.

Note that CVD methods can be classified into a plasma enhanced CVD (PECVD) method utilizing plasma, a thermal CVD (TCVD) method utilizing heat, and the like. The CVD methods can be further classified into a metal CVD (MCVD) method and a metal organic CVD (MOCVD) method according to a source gas to be used.

By using the PECVD method, a high-quality film can be formed at a relatively low temperature. By using the TCVD method, in which plasma is not used, a film can be formed with few defects because damage caused by plasma does not occur.

When the CVD method is used, composition of a film to be formed can be controlled with a flow rate ratio of the source gases. For example, by the MCVD method and the MOCVD method, a film with a certain composition can be formed depending on a flow rate ratio of the source gases. Moreover, with the MCVD method and the MOCVD method, by changing the flow rate ratio of the source gases while forming the film, a film whose composition is continuously changed can be formed. In the case where the film is formed while changing the flow rate ratio of the source gases, as compared to the case where the film is formed using a plurality of deposition chambers, time taken for the film formation can be reduced because time taken for transfer and pressure adjustment is omitted. Thus, transistors can be manufactured with improved productivity. A specific example of a deposition apparatus that can be used for the MOCVD method is described later.

Alternatively, the film whose composition is continuously changed may be formed by a sputtering method, an MBE method, a PLD method, or an ALD method.

The insulating film 102 is in contact with the semiconductor 106. Thus, it is preferable that a semiconductor to be the semiconductor 106 be formed by a formation method that does not damage the insulating film 102. That is, the semiconductor is preferably formed by the MOCVD method or the like, for example.

Note that in the case where the semiconductor 106 is formed to have a stacked-layer structure, films in the semiconductor 106 may be formed by different formation methods such as a sputtering method, a CVD method (a PECVD method, a TCVD method, an MCVD method, an MOCVD method, or the like), an MBE method, a PLD method, and an ALD method. For example, the first layer may be formed by an MOCVD method and the second layer may be formed by a sputtering method. Alternatively, the first layer may be formed by an ALD method and the second layer may be formed by an MOCVD method. Alternatively, the first layer may be formed by an ALD method and the second layer may be formed by a sputtering method. Alternatively, the first layer may be formed by an ALD method, the second layer may be formed by a sputtering method, and the third layer may be formed by an ALD method. Thus, when films are formed by different formation methods, the films can have different functions or different properties. Further, by stacking the films, a more appropriate film can be formed as a stacked-layer film.

In other words, in the case where the semiconductor 106 is a stacked-layer film, for example, an n-th film is formed by at least one of a CVD method (a PECVD method, a TCVD method, an MCVD method, an MOCVD method, or the like), an MBE method, a PLD method, an ALD method, and the like and an n+1-th film is formed by at least one of a CVD method (a PECVD method, a TCVD method, an MCVD method, an MOCVD method, or the like), an MBE method, a PLD method, an ALD method, and the like (n is a natural number). Note that the n-th film and the n+1-th film may be formed by different formation methods. Note that the n-th film and an n+2-th film may be formed by the same formation method. Alternatively, all the films may be formed by the same formation method.

Note that the semiconductor 106 or at least one film in the stacked semiconductor 106, and the insulating film 102 or at least one film in the stacked insulating film 102 may be formed by the same formation method. For example, both of them may be formed by an ALD method. Thus, they can be formed without exposure to the air. As a result, entry of impurities can be prevented. Alternatively, for example, the insulating film 102 and the semiconductor 106 in contact with each other may be formed by the same formation method. Thus, the formation can be performed in the same chamber. As a result, entry of impurities can be prevented. As described above, the same formation method may be employed in not only the case of the semiconductor 106 and the insulating film 102 but also the case of other films which are adjacent to each other. Note that a method for manufacturing a semiconductor device of one embodiment of the present invention is not limited thereto.

The conductive film 116a and the conductive film 116b each may be formed to have a single-layer structure or a stacked-layer structure using a conductive film containing one or more kinds of aluminum, titanium, chromium, cobalt, nickel, copper, yttrium, zirconium, molybdenum, ruthenium, silver, tantalum, and tungsten, for example.

A conductive film to be the conductive film 116a and the conductive film 116b may be formed by a sputtering method, a CVD method, an MBE method, a PLD method, an ALD method, or the like.

The conductive film 116a and the conductive film 116b are formed in such a manner that the conductive film to be the conductive film 116a and the conductive film 116b is formed and then partly etched. Therefore, it is preferable to employ a formation method by which the semiconductor 106 is not damaged when the conductive film is formed. In other words, the conductive film is preferably formed by an MCVD method or the like.

Note that in the case where the conductive film 116a and the conductive film 116b are each formed to have a stacked-layer structure, films in the stacked-layer film may be formed by different formation methods such as a CVD method (a PECVD method, a TCVD method, an MCVD method, an MOCVD method, or the like), an MBE method, a PLD method, and an ALD method. For example, the first layer may be formed by an MOCVD method and the second layer may be formed by a sputtering method. Alternatively, the first layer may be formed by an ALD method and the second layer may be formed by an MOCVD method. Alternatively, the first layer may be formed by an ALD method and the second layer may be formed by a sputtering method. Alternatively, the first layer may be formed by an ALD method, the second layer may be formed by a sputtering method, and the third layer may be formed by an ALD method. Thus, when films are formed by different formation methods, the films can have different functions or different properties. Further, by stacking the films, a more appropriate film can be formed as a stacked-layer film.

In other words, in the case where the conductive film 116a and the conductive film 116b are each a stacked-layer film, for example, an n-th film is formed by at least one of a CVD method (a PECVD method, a TCVD method, an MCVD method, an MOCVD method, or the like), an MBE method, a PLD method, an ALD method, and the like and an n+1-th film is formed by at least one of a CVD method (a PECVD method, a TCVD method, an MCVD method, an MOCVD method, or the like), an MBE method, a PLD method, an ALD method, and the like (n is a natural number). Note that the n-th film and the n+1-th film may be formed by different formation methods. Note that the n-th film and an n+2-th film may be formed by the same formation method. Alternatively, all the films may be formed by the same formation method.

Note that the conductive film 116a (conductive film 116b) or at least one film in the stacked conductive film 116a (conductive film 116b), and the semiconductor 106 or at least one film in the stacked semiconductor 106 may be formed by the same formation method. For example, both of them may be formed by an ALD method. Thus, they can be formed without exposure to the air. As a result, entry of impurities can be prevented. Alternatively, for example, the conductive film 116a (conductive film 116b) and the semiconductor 106 in contact with each other may be formed by the same formation method. Thus, the formation can be performed in the same chamber. As a result, entry of impurities can be prevented. As described above, the same formation method may be employed in not only the case of the semiconductor 106 and the conductive film 116a (conductive film 116b) but also the case of other films which are adjacent to each other. Note that a method for manufacturing a semiconductor device of one embodiment of the present invention is not limited thereto.

Note that the conductive film 116a (conductive film 116b) or at least one film in the stacked conductive film 116a (conductive film 116b), the semiconductor 106 or at least one film in the stacked semiconductor 106, and the insulating film 102 or at least one film in the stacked insulating film 102 may be formed by the same formation method. For example, all of them may be formed by an ALD method. Thus, they can be formed without exposure to the air. As a result, entry of impurities can be prevented. Note that a method for manufacturing a semiconductor device of one embodiment of the present invention is not limited thereto.

The insulating film 112 may be formed of, for example, a single layer or a stack of an insulating film containing aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

Note that in the case where the insulating film 112 is formed to have a stacked-layer structure, films in the insulating film 112 may be formed by different formation methods such as a CVD method (a PECVD method, a TCVD method, an MCVD method, an MOCVD method, or the like), an MBE method, a PLD method, and an ALD method. For example, the first layer may be formed by an MOCVD method and the second layer may be formed by a sputtering method. Alternatively, the first layer may be formed by an ALD method and the second layer may be formed by an MOCVD method. Alternatively, the first layer may be formed by an ALD method and the second layer may be formed by a sputtering method. Alternatively, the first layer may be formed by an ALD method, the second layer may be formed by a sputtering method, and the third layer may be formed by an ALD method. Thus, when films are formed by different formation methods, the films can have different functions or different properties. Further, by stacking the films, a more appropriate film can be formed as a stacked-layer film.

In other words, in the case where the insulating film 112 is a stacked-layer film, for example, an n-th film is formed by at least one of a CVD method (a PECVD method, a TCVD method, an MCVD method, an MOCVD method, or the like), an MBE method, a PLD method, an ALD method, and the like and an n+1-th film is formed by at least one of a CVD method (a PECVD method, a TCVD method, an MCVD method, an MOCVD method, or the like), an MBE method, a PLD method, an ALD method, and the like (n is a natural number). Note that the n-th film and the n+1-th film may be formed by different formation methods. Note that the n-th film and an n+2-th film may be formed by the same formation method. Alternatively, all the films may be formed by the same formation method.

Note that the insulating film 112 or at least one film in the stacked insulating film 112, and the conductive film 116a (conductive film 116b) or at least one film in the stacked conductive film 116a (conductive film 116b) may be formed by the same formation method. For example, both of them may be formed by an ALD method. Thus, they can be formed without exposure to the air. As a result, entry of impurities can be prevented. Alternatively, for example, the conductive film 116a (conductive film 116b) and the insulating film 112 in contact with each other may be formed by the same formation method. Thus, the formation can be performed in the same chamber. As a result, entry of impurities can be prevented.

Note that the insulating film 112 or at least one film in the stacked insulating film 112, the conductive film 116a (conductive film 116b) or at least one film in the stacked conductive film 116a (conductive film 116b), the semiconductor 106 or at least one film in the stacked semiconductor 106, and the insulating film 102 or at least one film in the stacked insulating film 102 may be formed by the same formation method. For example, all of them may be formed by an ALD method. Thus, they can be formed without exposure to the air. As a result, entry of impurities can be prevented. Note that a method for manufacturing a semiconductor device of one embodiment of the present invention is not limited thereto.

The conductive film 104 may be formed to have a single-layer structure or a stacked-layer structure using a conductive film containing one or more kinds of aluminum, titanium, chromium, cobalt, nickel, copper, yttrium, zirconium, molybdenum, ruthenium, silver, tantalum, and tungsten, for example.

A conductive film to be the conductive film 104 may be formed by a sputtering method, a CVD method, an MBE method, a PLD method, an ALD method, or the like.

The insulating film 112 functions as a gate insulating film of a transistor. Therefore, the conductive film 104 is preferably formed by a formation method by which the insulating film 112 is not damaged when the conductive film to be the conductive film 104 is formed. In other words, the conductive film is preferably formed by an MCVD method or the like.

Note that in the case where the conductive film 104 is formed to have a stacked-layer structure, films in the conductive film 104 may be formed by different formation methods such as a CVD method (a PECVD method, a TCVD method, an MCVD method, an MOCVD method, or the like), an MBE method, a PLD method, and an ALD method. For example, the first layer may be formed by an MOCVD method and the second layer may be formed by a sputtering method. Alternatively, the first layer may be formed by an ALD method and the second layer may be formed by an MOCVD method. Alternatively, the first layer may be formed by an ALD method and the second layer may be formed by a sputtering method. Alternatively, the first layer may be formed by an ALD method, the second layer may be formed by a sputtering method, and the third layer may be formed by an ALD method. Thus, when films are formed by different formation methods, the films can have different functions or different properties. Further, by stacking the films, a more appropriate film can be formed as a stacked-layer film.

In other words, in the case where the conductive film 104 is a stacked-layer film, for example, an n-th film is formed by at least one of a CVD method (a PECVD method, a TCVD method, an MCVD method, an MOCVD method, or the like), an MBE method, a PLD method, an ALD method, and the like and an n+1-th film is formed by at least one of a CVD method (a PECVD method, a TCVD method, an MCVD method, an MOCVD method, or the like), an MBE method, a PLD method, an ALD method, and the like (n is a natural number). Note that the n-th film and the n+1-th film may be formed by different formation methods. Note that the n-th film and an n+2-th film may be formed by the same formation method. Alternatively, all the films may be formed by the same formation method.

Note that the conductive film 104 or at least one film in the stacked conductive film 104, and the insulating film 112 or at least one film in the stacked insulating film 112 may be formed by the same formation method. For example, both of them may be formed by an ALD method. Thus, they can be formed without exposure to the air. As a result, entry of impurities can be prevented. Alternatively, for example, the conductive film 104 and the insulating film 112 in contact with each other may be formed by the same formation method. Thus, the formation can be performed in the same chamber. As a result, entry of impurities can be prevented.

Note that the conductive film 104 or at least one film in the stacked conductive film 104, the insulating film 112 or at least one film in the stacked insulating film 112, the conductive film 116a (conductive film 116b) or at least one film in the stacked conductive film 116a (conductive film 116b), the semiconductor 106 or at least one film in the stacked semiconductor 106, and the insulating film 102 or at least one film in the stacked insulating film 102 may be formed by the same formation method. For example, all of them may be formed by an ALD method. Thus, they can be formed without exposure to the air. As a result, entry of impurities can be prevented. Note that a method for manufacturing a semiconductor device of one embodiment of the present invention is not limited thereto.

The insulating film 110 may be formed of, for example, a single layer or a stack of an insulating film containing aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide. Alternatively, a resin such as polyimide, acrylic, or silicone may be used.

Note that in the case where the insulating film 110 is formed to have a stacked-layer structure, films in the insulating film 110 may be formed by different formation methods such as a CVD method (a PECVD method, a TCVD method, an MCVD method, an MOCVD method, or the like), an MBE method, a PLD method, and an ALD method. For example, the first layer may be formed by an MOCVD method and the second layer may be formed by a sputtering method. Alternatively, the first layer may be formed by an ALD method and the second layer may be formed by an MOCVD method. Alternatively, the first layer may be formed by an ALD method and the second layer may be formed by a sputtering method. Alternatively, the first layer may be formed by an ALD method, the second layer may be formed by a sputtering method, and the third layer may be formed by an ALD method. Thus, when films are formed by different formation methods, the films can have different functions or different properties. Further, by stacking the films, a more appropriate film can be formed as a stacked-layer film.

In other words, in the case where the insulating film 110 is a stacked-layer film, for example, an n-th film is formed by at least one of a CVD method (a PECVD method, a TCVD method, an MCVD method, an MOCVD method, or the like), an MBE method, a PLD method, an ALD method, and the like and an n+1-th film is formed by at least one of a CVD method (a PECVD method, a TCVD method, an MCVD method, an MOCVD method, or the like), an MBE method, a PLD method, an ALD method, and the like (n is a natural number). Note that the n-th film and the n+1-th film may be formed by different formation methods. Note that the n-th film and an n+2-th film may be formed by the same formation method. Alternatively, all the films may be formed by the same formation method.

The conductive film 105 may be formed to have a single-layer structure or a stacked-layer structure using a conductive film containing one or more kinds of aluminum, titanium, chromium, cobalt, nickel, copper, yttrium, zirconium, molybdenum, ruthenium, silver, tantalum, and tungsten, for example.

A conductive film to be the conductive film 105 may be formed by a sputtering method, a CVD method, an MBE method, a PLD method, an ALD method, or the like.

Note that in the case where the conductive film 105 is formed to have a stacked-layer structure, films in the conductive film 105 may be formed by different formation methods such as a CVD method (a PECVD method, a TCVD method, an MCVD method, an MOCVD method, or the like), an MBE method, a PLD method, and an ALD method. For example, the first layer may be formed by an MOCVD method and the second layer may be formed by a sputtering method. Alternatively, the first layer may be formed by an ALD method and the second layer may be formed by an MOCVD method. Alternatively, the first layer may be formed by an ALD method and the second layer may be formed by a sputtering method. Alternatively, the first layer may be formed by an ALD method, the second layer may be formed by a sputtering method, and the third layer may be formed by an ALD method. Thus, when films are formed by different formation methods, the films can have different functions or different properties. Further, by stacking the films, a more appropriate film can be formed as a stacked-layer film.

In other words, in the case where the conductive film 105 is a stacked-layer film, for example, an n-th film is formed by at least one of a CVD method (a PECVD method, a TCVD method, an MCVD method, an MOCVD method, or the like), an MBE method, a PLD method, an ALD method, and the like and an n+1-th film is formed by at least one of a CVD method (a PECVD method, a TCVD method, an MCVD method, an MOCVD method, or the like), an MBE method, a PLD method, an ALD method, and the like (n is a natural number). Note that the n-th film and the n+1-th film may be formed by different formation methods. Note that the n-th film and an n+2-th film may be formed by the same formation method. Alternatively, all the films may be formed by the same formation method.

The insulating film 113 may be formed of, for example, a single layer or a stack of an insulating film containing aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide. Alternatively, a resin such as polyimide, acrylic, or silicone may be used.

Note that in the case where the insulating film 113 is formed to have a stacked-layer structure, films in the insulating film 113 may be formed by different formation methods such as a CVD method (a PECVD method, a TCVD method, an MCVD method, an MOCVD method, or the like), an MBE method, a PLD method, and an ALD method. For example, the first layer may be formed by an MOCVD method and the second layer may be formed by a sputtering method. Alternatively, the first layer may be formed by an ALD method and the second layer may be formed by an MOCVD method. Alternatively, the first layer may be formed by an ALD method and the second layer may be formed by a sputtering method. Alternatively, the first layer may be formed by an ALD method, the second layer may be formed by a sputtering method, and the third layer may be formed by an ALD method. Thus, when films are formed by different formation methods, the films can have different functions or different properties. Further, by stacking the films, a more appropriate film can be formed as a stacked-layer film.

In other words, in the case where the insulating film 113 is a stacked-layer film, for example, an n-th film is formed by at least one of a CVD method (a PECVD method, a TCVD method, an MCVD method, an MOCVD method, or the like), an MBE method, a PLD method, an ALD method, and the like and an n+1-th film is formed by at least one of a CVD method (a PECVD method, a TCVD method, an MCVD method, an MOCVD method, or the like), an MBE method, a PLD method, an ALD method, and the like (n is a natural number). Note that the n-th film and the n+1-th film may be formed by different formation methods. Note that the n-th film and an n+2-th film may be formed by the same formation method. Alternatively, all the films may be formed by the same formation method.

The conductive film 108 may be formed to have a single-layer structure or a stacked-layer structure using a conductive film containing one or more kinds of aluminum, titanium, chromium, cobalt, nickel, copper, yttrium, zirconium, molybdenum, ruthenium, silver, tantalum, and tungsten, for example.

A conductive film to be the conductive film 108 may be formed by a sputtering method, a CVD method, an MBE method, a PLD method, an ALD method, or the like.

Note that in the case where the conductive film 108 is formed to have a stacked-layer structure, films in the conductive film 108 may be formed by different formation methods such as a CVD method (a PECVD method, a TCVD method, an MCVD method, an MOCVD method, or the like), an MBE method, a PLD method, and an ALD method. For example, the first layer may be formed by an MOCVD method and the second layer may be formed by a sputtering method. Alternatively, the first layer may be formed by an ALD method and the second layer may be formed by an MOCVD method. Alternatively, the first layer may be formed by an ALD method and the second layer may be formed by a sputtering method. Alternatively, the first layer may be formed by an ALD method, the second layer may be formed by a sputtering method, and the third layer may be formed by an ALD method. Thus, when films are formed by different formation methods, the films can have different functions or different properties. Further, by stacking the films, a more appropriate film can be formed as a stacked-layer film.

In other words, in the case where the conductive film 108 is a stacked-layer film, for example, an n-th film is formed by at least one of a CVD method (a PECVD method, a TCVD method, an MCVD method, an MOCVD method, or the like), an MBE method, a PLD method, an ALD method, and the like and an n+1-th film is formed by at least one of a CVD method (a PECVD method, a TCVD method, an MCVD method, an MOCVD method, or the like), an MBE method, a PLD method, an ALD method, and the like (n is a natural number). Note that the n-th film and the n+1-th film may be formed by different formation methods. Note that the n-th film and an n+2-th film may be formed by the same formation method. Alternatively, all the films may be formed by the same formation method.

Figure 2A:
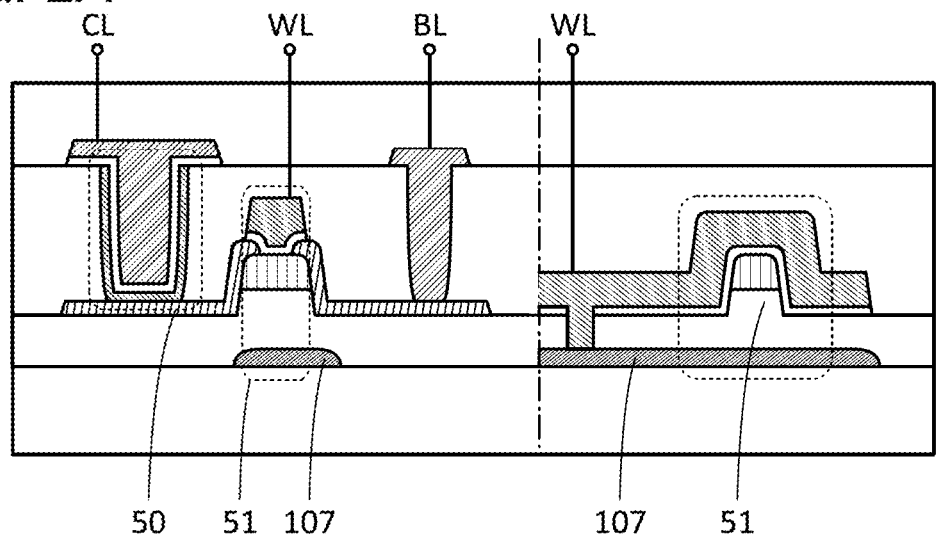
FIGS. 2A and 2B are each a cross-sectional view illustrating an example of a semiconductor device of one embodiment of the present invention.
Figure 2B:
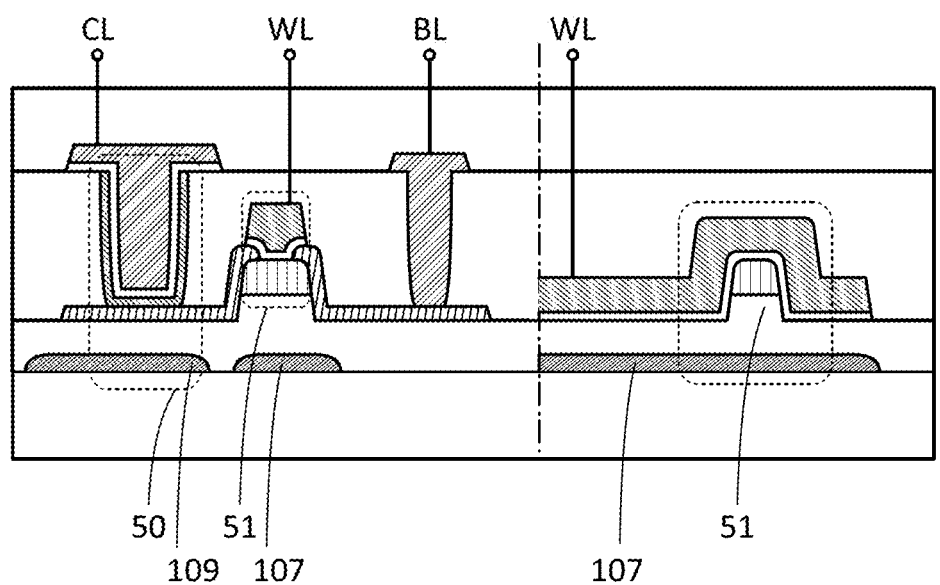
Figure 3A:
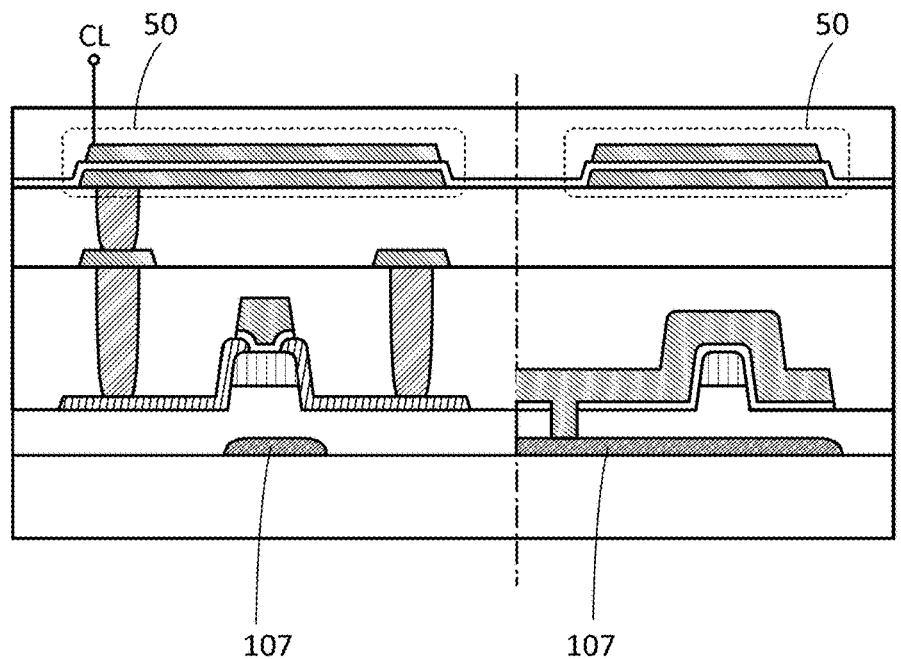
FIGS. 3A and 3B are each a cross-sectional view illustrating an example of a semiconductor device of one embodiment of the present invention.
Figure 3B:
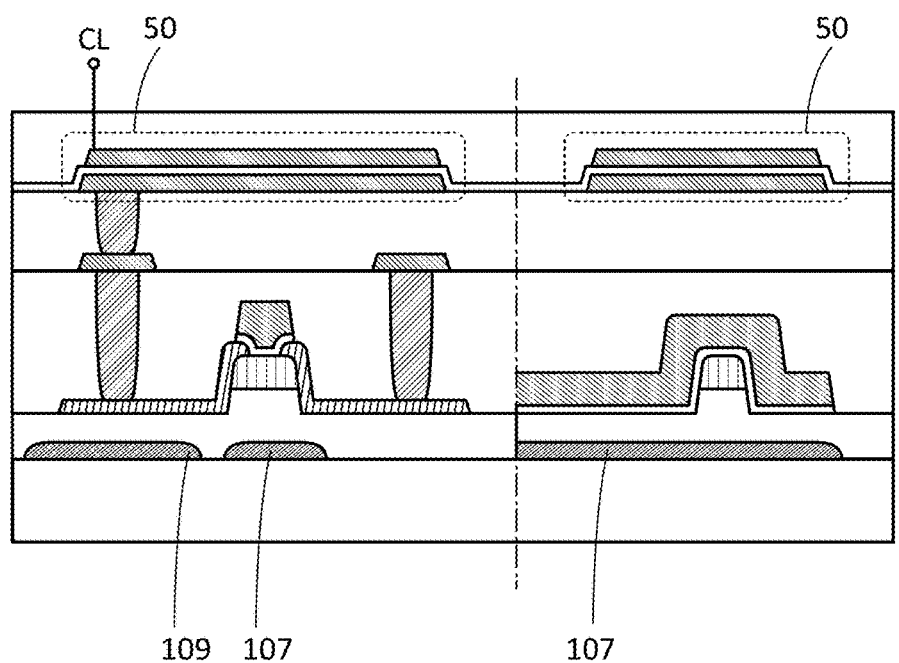

Although the conductive film 104 having a function of a gate electrode of the transistor 51 is provided over the channel formation region in FIG. 1B and the like, one embodiment of the present invention is not limited thereto. A conductive film may additionally be provided under the channel formation region. FIG. 2A illustrates an example of the case where a conductive film 107 is provided under the insulating film 102 in the structure in FIG. 1B. Similarly, FIG. 3A illustrates an example of the case where the conductive film 107 is provided under the insulating film 102. Note that a conductive film 109 which is formed at the same time as the conductive film 107 may be provided (see FIG. 2B and FIG. 3B). The conductive film 109 includes a region overlapping with the conductive film 116a. Thus, a capacitor can be formed using the region. Note that the conductive film 109 may be connected to the conductive film 105. Consequently, a capacitor is formed including the conductive film 116a.

Note that the conductive film 107 and the conductive film 104 may be supplied with the same signal or the same potential, or may be supplied with different signals or different potentials. In the case where the same signal or the same potential is supplied, the conductive film 107 and the conductive film 104 may be connected to each other through an opening portion as in FIG. 2A and FIG. 3A.

The conductive film 107 and the conductive film 109 may each be formed by a method similar to the method for forming the conductive film 104. The conductive film 107 and the conductive film 109 may each include a conductive film similar to the conductive film included in the conductive film 104.

<Oxide Semiconductor>

An oxide semiconductor which can be used for the semiconductor 106 is described in detail below.

The oxide semiconductor which can be used for the semiconductor 106 is an oxide containing indium. An oxide can have high carrier mobility (electron mobility) by containing indium, for example. An oxide semiconductor preferably contains an element M. The element M is preferably aluminum, gallium, yttrium, tin, or the like. Other elements which can be used as the element M are boron, silicon, titanium, iron, nickel, germanium, yttrium, zirconium, molybdenum, lanthanum, cerium, neodymium, hafnium, tantalum, tungsten, and the like. Note that two or more of the above elements may be used in combination as the element M. The element M is an element having high bonding energy with oxygen, for example. The element M is an element that can increase the energy gap of the oxide, for example.

Furthermore, the oxide semiconductor preferably contains zinc. When the oxide contains zinc, the oxide can be easily crystallized, for example.

Note that the oxide semiconductor is not limited to the oxide containing indium. The oxide semiconductor may be, for example, zinc tin oxide or gallium tin oxide.

For the oxide semiconductor, an oxide with a wide energy gap is used. For example, the energy gap of the oxide semiconductor is greater than or equal to 2.5 eV and less than or equal to 4.2 eV, preferably greater than or equal to 2.8 eV and less than or equal to 3.8 eV, more preferably greater than or equal to 3 eV and less than or equal to 3.5 eV.

An influence of impurities in the oxide semiconductor is described below. In order to obtain stable electrical characteristics of a transistor, it is effective to reduce the concentration of impurities in the oxide semiconductor to have lower carrier density so that the oxide semiconductor is highly purified. The carrier density of the oxide semiconductor is set to be lower than $1\times10^{17}/cm^3$, lower than $1\times10^{15}/cm^3$, or lower than $1\times10^{13}/cm^3$. In order to reduce the concentration of impurities in the oxide semiconductor, the concentration of impurities in a film which is adjacent to the oxide semiconductor is preferably reduced.

For example, silicon in the oxide semiconductor might serve as a carrier trap or a carrier generation source. Therefore, the concentration of silicon in a region between the oxide semiconductor and the insulating film 102 measured by secondary ion mass spectrometry (SIMS) is set to be lower than $1\times10^{19}$ atoms/$cm^3$, preferably lower than $5\times10^{18}$ atoms/$cm^3$, further preferably lower than $2\times10^{18}$ atoms/$cm^3$. The concentration of silicon in a region between the oxide semiconductor and the insulating film 112 measured by SIMS is set to be lower than $1\times10^{19}$ atoms/$cm^3$, preferably lower than $5\times10^{18}$ atoms/$cm^3$, further preferably lower than $2\times10^{18}$ atoms/$cm^3$.

Furthermore, when hydrogen is contained in the oxide semiconductor, the carrier density is increased in some cases. The concentration of hydrogen in the oxide semiconductor measured by SIMS is set to be lower than or equal to $2\times10^{20}$ atoms/$cm^3$, preferably lower than or equal to $5\times10^{19}$ atoms/$cm^3$, further preferably lower than or equal to $1\times10^{19}$ atoms/$cm^3$, still further preferably lower than or equal to $5\times10^{18}$ atoms/$cm^3$. When nitrogen is contained in the oxide semiconductor, the carrier density is increased in some cases. The concentration of nitrogen in the oxide semiconductor measured by SIMS is set to be lower than $5\times10^{19}$ atoms/$cm^3$, preferably lower than or equal to $5\times10^{18}$ atoms/$cm^3$, further preferably lower than or equal to $1\times10^{18}$ atoms/$cm^3$, still further preferably lower than or equal to $5\times10^{17}$ atoms/$cm^3$.

It is preferable to reduce the concentration of hydrogen in the insulating film 102 in order to reduce the concentration of hydrogen in the oxide semiconductor. The concentration of hydrogen in the insulating film 102 measured by SIMS is set to be lower than or equal to $2\times10^{20}$ atoms/$cm^3$, preferably lower than or equal to $5\times10^{19}$ atoms/$cm^3$, further preferably lower than or equal to $1\times10^{19}$ atoms/$cm^3$, still further preferably lower than or equal to $5\times10^{18}$ atoms/$cm^3$. It is preferable to reduce the concentration of nitrogen in the insulating film 102 in order to reduce the concentration of nitrogen in the oxide semiconductor. The concentration of nitrogen in the insulating film 102 measured by SIMS is set to be lower than $5\times10^{19}$ atoms/$cm^3$, preferably lower than or equal to $5\times10^{18}$ atoms/$cm^3$, further preferably lower than or equal to $1\times10^{18}$ atoms/$cm^3$, still further preferably lower than or equal to $5\times10^{17}$ atoms/$cm^3$.

It is preferable to reduce the concentration of hydrogen in the insulating film 112 in order to reduce the concentration of hydrogen in the oxide semiconductor. The concentration of hydrogen in the insulating film 112 measured by SIMS is set to be lower than or equal to $2\times10^{20}$ atoms/$cm^3$, preferably lower than or equal to $5\times10^{19}$ atoms/$cm^3$, further preferably lower than or equal to $1\times10^{19}$ atoms/$cm^3$, still further preferably lower than or equal to $5\times10^{18}$ atoms/$cm^3$. It is preferable to reduce the concentration of nitrogen in the insulating film 112 in order to reduce the concentration of nitrogen in the oxide semiconductor. The concentration of nitrogen in the insulating film 112 measured by SIMS is set to be lower than $5\times10^{19}$ atoms/$cm^3$, preferably lower than or equal to $5\times10^{18}$ atoms/$cm^3$, further preferably lower than or equal to $1\times10^{18}$ atoms/$cm^3$, still further preferably lower than or equal to $5\times10^{17}$ atoms/$cm^3$.

The structure of an oxide semiconductor is described below.

Oxide semiconductors are classified roughly into a single-crystal oxide semiconductor and a non-single-crystal oxide semiconductor. The non-single-crystal oxide semiconductor includes any of a c-axis aligned crystalline oxide semiconductor (CAAC-OS), a polycrystalline oxide semiconductor, a microcrystalline oxide semiconductor, an amorphous oxide semiconductor, and the like.

First, a CAAC-OS is described.

The CAAC-OS is one of oxide semiconductors including a plurality of crystal parts, and most of the crystal parts each fit inside a cube whose one side is less than 100 nm. Thus, there is a case where a crystal part included in the CAAC-OS fits inside a cube whose one side is less than 10 nm, less than 5 nm, or less than 3 nm.

In a transmission electron microscope (TEM) image of the CAAC-OS, a boundary between crystal parts, that is, a grain boundary is not clearly observed. Thus, in the CAAC-OS, a reduction in electron mobility due to the grain boundary is less likely to occur.

According to the TEM image of the CAAC-OS observed in a direction substantially parallel to a sample surface (cross-sectional TEM image), metal atoms are arranged in a layered manner in the crystal parts. Each metal atom layer has a morphology reflecting a surface over which the CAAC-OS is formed (hereinafter, a surface over which the CAAC-OS is formed is referred to as a formation surface) or a top surface of the CAAC-OS, and is arranged parallel to the formation surface or the top surface of the CAAC-OS.

On the other hand, according to the TEM image of the CAAC-OS observed in a direction substantially perpendicular to the sample surface (plan-view TEM image), metal atoms are arranged in a triangular or hexagonal configuration in the crystal parts. However, there is no regularity of arrangement of metal atoms between different crystal parts.

Note that in an electron diffraction pattern of the CAAC-OS, spots (luminescent spots) having alignment are shown. For example, when electron diffraction with an electron beam having a diameter of 1 nm or more and 30 nm or less (such electron diffraction is also referred to as nanobeam electron diffraction) is performed on the top surface of the CAAC-OS film, spots are observed (see FIG. 19A).

From the results of the cross-sectional TEM image and the plan-view TEM image, alignment is found in the crystal parts in the CAAC-OS.

A CAAC-OS is subjected to structural analysis with an X-ray diffraction (XRD) apparatus. For example, when the CAAC-OS including an $InGaZnO_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS have c-axis alignment, and that the c-axes are aligned in a direction substantially perpendicular to the formation surface or the top surface of the CAAC-OS.

In this specification, the trigonal and rhombohedral crystal systems are included in the hexagonal crystal system.

On the other hand, when the CAAC-OS is analyzed by an in-plane method in which an X-ray enters a sample in a direction substantially perpendicular to the c-axis, a peak appears frequently when 2θ is around 56°. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor of InGaZnO$_4$, six peaks appear. The six peaks are derived from crystal planes equivalent to the (110) plane. On the other hand, in the case of a CAAC-OS, a peak is not clearly observed even when φ scan is performed with 2θ fixed at around 56°.

According to the above results, in the CAAC-OS having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS is changed by etching or the like, the c-axis might not be necessarily parallel to a normal vector of a formation surface or a normal vector of a top surface of the CAAC-OS.

Furthermore, the degree of crystallinity in the CAAC-OS is not necessarily uniform. For example, in the case where crystal growth leading to the CAAC-OS occurs from the vicinity of the top surface of the film, the degree of the crystallinity in the vicinity of the top surface is higher than that in the vicinity of the formation surface in some cases. Furthermore, when an impurity is added to the CAAC-OS, the crystallinity in a region to which the impurity is added is changed, and the degree of crystallinity in the CAAC-OS varies depending on regions.

Note that when the CAAC-OS with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS. It is preferable that in the CAAC-OS, a peak of 2θ appear at around 31° and a peak of 2θ not appear at around 36°.

The CAAC-OS is an oxide semiconductor with a low impurity concentration. The impurity means an element other than main components of the oxide semiconductor, such as hydrogen, carbon, silicon, or a transition metal element. In particular, an element that has higher bonding strength to oxygen than a metal element included in the oxide semiconductor, such as silicon, disturbs the atomic arrangement of the oxide semiconductor by depriving the oxide semiconductor of oxygen and causes a decrease in crystallinity. In addition, a heavy metal such as iron or nickel, argon, carbon dioxide, or the like has a large atomic radius (or molecular radius), and thus disrupts the atomic arrangement in the oxide semiconductor, whereby the crystallinity of the oxide semiconductor is lowered in some cases. Note that the impurity included in the oxide semiconductor might serve as a carrier trap or a carrier generation source.

The CAAC-OS is an oxide semiconductor having a low density of defect states. In some cases, oxygen vacancies in the oxide semiconductor serve as carrier traps or carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor has few carrier generation sources, and thus has a low carrier density in some cases. Thus, a transistor including the oxide semiconductor rarely has a negative threshold voltage (is rarely normally on). The highly purified intrinsic or substantially highly purified intrinsic oxide semiconductor has few carrier traps. Accordingly, the transistor including the oxide semiconductor has little variation in electrical characteristics and high reliability. Charges trapped by the carrier traps in the oxide semiconductor take a long time to be released. The trapped charges may behave like fixed electric charges. Thus, the transistor which includes the oxide semiconductor having high impurity concentration and a high density of defect states has unstable electrical characteristics in some cases.

With the use of the CAAC-OS in a transistor, variation in the electrical characteristics of the transistor due to irradiation with visible light or ultraviolet light is small.

Next, a microcrystalline oxide semiconductor is described.

In an image obtained with the TEM, crystal parts cannot be found clearly in the microcrystalline oxide semiconductor in some cases. In most cases, the size of a crystal part in the microcrystalline oxide semiconductor is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor including nanocrystal is referred to as an nc-OS (nanocrystalline oxide semiconductor). In an image obtained with TEM, a grain boundary cannot be found clearly in the nc-OS in some cases.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different crystal parts in the nc-OS; thus, the orientation of the whole nc-OS is not observed. Accordingly, in some cases, the nc-OS cannot be distinguished from an amorphous oxide semiconductor depending on an analysis method. For example, when the nc-OS is subjected to structural analysis by an out-of-plane method with an XRD apparatus using an X-ray having a diameter larger than the diameter of a crystal part, a peak which shows a crystal plane does not appear. Furthermore, a halo pattern is shown in an electron diffraction pattern (also referred to as a selected area electron diffraction pattern) of the nc-OS obtained by using an electron beam having a probe diameter (e.g., larger than or equal to 50 nm)

larger than the diameter of a crystal part. Meanwhile, spots are shown in a nanobeam electron diffraction pattern of the nc-OS obtained by using an electron beam having a probe diameter close to, or smaller than the diameter of a crystal part. Furthermore, in a nanobeam electron diffraction pattern of the nc-OS, regions with high luminance in a circular (ring) pattern are shown in some cases. Also in a nanobeam electron diffraction pattern of the nc-OS, a plurality of spots are shown in a ring-like region in some cases (see FIG. 19B).

The nc-OS is an oxide semiconductor having more regularity than an amorphous oxide semiconductor. Therefore, the nc-OS has a lower density of defect states than an amorphous oxide semiconductor. However, there is no regularity of crystal orientation between different crystal parts in the nc-OS. Therefore, the nc-OS has a higher density of defect states than the CAAC-OS.

Note that an oxide semiconductor may include two or more of an amorphous oxide semiconductor, a microcrystalline oxide semiconductor, and a CAAC-OS, for example.

In the case where the oxide semiconductor has a plurality of structures, the structures can be analyzed using nanobeam electron diffraction in some cases.

Figure 20A:
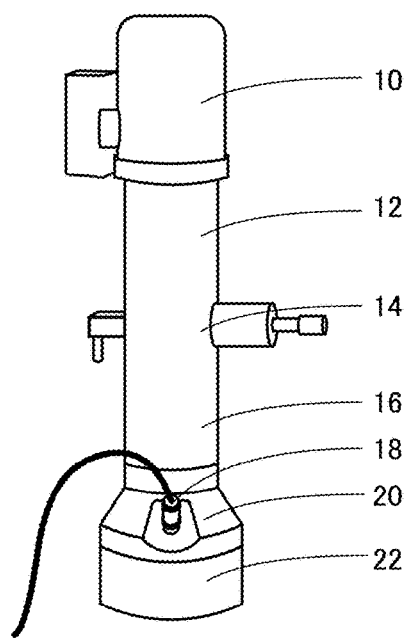
FIGS. 20A and 20B illustrate an example of a transmission electron diffraction measurement apparatus.

FIG. 20A illustrates a transmission electron diffraction measurement apparatus which includes an electron gun chamber 10, an optical system 12 below the electron gun chamber 10, a sample chamber 14 below the optical system 12, an optical system 16 below the sample chamber 14, an observation chamber 20 below the optical system 16, a camera 18 installed in the observation chamber 20, and a film chamber 22 below the observation chamber 20. The camera 18 is provided to face toward the inside of the observation chamber 20. Note that the film chamber 22 is not necessarily provided.

Figure 20B:
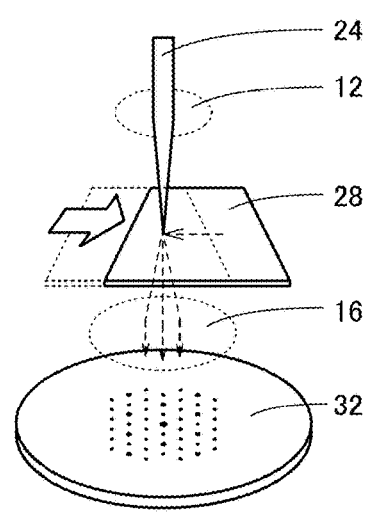

FIG. 20B illustrates an internal structure of the transmission electron diffraction measurement apparatus illustrated in FIG. 20A. In the transmission electron diffraction measurement apparatus, a substance 28 which is positioned in the sample chamber 14 is irradiated with electrons emitted from an electron gun installed in the electron gun chamber 10 through the optical system 12. Electrons passing through the substance 28 enter a fluorescent plate 32 provided in the observation chamber 20 through the optical system 16. On the fluorescent plate 32, a pattern corresponding to the intensity of the incident electron appears, which allows measurement of a transmission electron diffraction pattern.

The camera 18 is installed so as to face the fluorescent plate 32 and can take a picture of a pattern appearing in the fluorescent plate 32. An angle formed by a straight line which passes through the center of a lens of the camera 18 and the center of the fluorescent plate 32 and an upper surface of the fluorescent plate 32 is, for example, 15° or more and 80° or less, 30° or more and 75° or less, or 45° or more and 70° or less. As the angle is reduced, distortion of the transmission electron diffraction pattern taken by the camera 18 becomes larger. Note that if the angle is obtained in advance, the distortion of an obtained transmission electron diffraction pattern can be corrected. Note that the film chamber 22 may be provided with the camera 18. For example, the camera 18 may be set in the film chamber 22 so as to be opposite to the incident direction of electrons 24. In this case, a transmission electron diffraction pattern with less distortion can be taken from the rear surface of the fluorescent plate 32.

A holder for fixing the substance 28 that is a sample is provided in the sample chamber 14. The holder transmits electrons passing through the substance 28. The holder may have, for example, a function of moving the substance 28 in the direction of the X, Y, and Z axes. The movement function of the holder may have an accuracy of moving the substance in the range of, for example, 1 nm to 10 nm, 5 nm to 50 nm, 10 nm to 100 nm, 50 nm to 500 nm, and 100 nm to 1 μm. The range is preferably determined to be an optimal range for the structure of the substance 28.

Then, a method for measuring a transmission electron diffraction pattern of a substance by the transmission electron diffraction measurement apparatus described above is described.

Figure 19A:
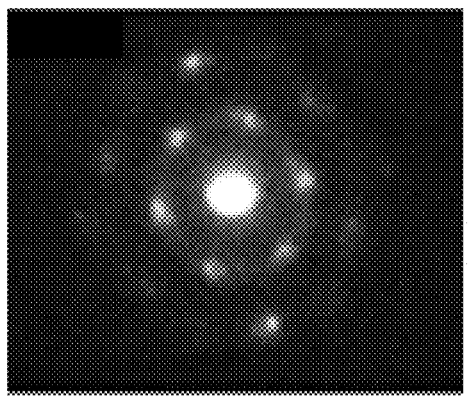
FIGS. 19A and 19B each show a nanobeam electron diffraction pattern of an oxide semiconductor film.
Figure 19B:
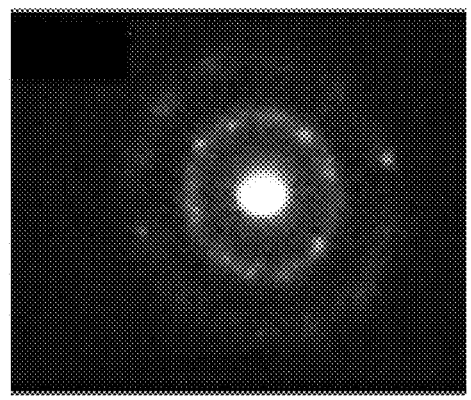

For example, changes in the structure of a substance can be observed by changing (scanning) the irradiation position of the electrons 24 that are a nanobeam in the substance, as illustrated in FIG. 20B. At this time, when the substance 28 is a CAAC-OS, a diffraction pattern as shown in FIG. 19A is observed. When the substance 28 is an nc-OS, a diffraction pattern shown in FIG. 19B is observed.

Even when the substance 28 is a CAAC-OS, a diffraction pattern similar to that of an nc-OS or the like is partly observed in some cases. Therefore, whether or not a CAAC-OS is favorable can be determined by the proportion of a region where a diffraction pattern of a CAAC-OS is observed in a predetermined area (also referred to as proportion of CAAC). In the case of a high quality CAAC-OS, for example, the proportion of CAAC is higher than or equal to 60%, preferably higher than or equal to 80%, further preferably higher than or equal to 90%, still further preferably higher than or equal to 95%. Note that a region where a diffraction pattern different from that of a CAAC-OS is observed is referred to as the proportion of not-CAAC.

For example, transmission electron diffraction patterns were obtained by scanning a top surface of a sample including a CAAC-OS obtained just after deposition (represented as "as-depo") and a top surface of a sample including a CAAC-OS subjected to heat treatment at 350° C. or 450° C. Here, the proportion of CAAC was obtained in such a manner that diffraction patterns were observed by scanning for 60 seconds at a rate of 5 nm/second and the obtained diffraction patterns were converted into still images every 0.5 seconds. Note that as an electron beam, a nanobeam with a probe diameter of 1 nm was used.

FIG. 21 shows the proportion of CAAC in each sample. The proportion of CAAC of the sample after heat treatment at 450° C. is high compared with those of the sample of as-depo and the sample after heat treatment at 350° C. That is, heat treatment at a temperature higher than 350° C. (e.g., higher than or equal to 400° C.) reduces the proportion of non-CAAC (increases the proportion of CAAC). Here, most of diffraction patterns different from that of a CAAC-OS are diffraction patterns similar to that of an nc-OS. Therefore, the above results suggest that the region having a structure similar to that of an nc-OS becomes CAAC by the heat treatment owing to the influence of the structure of the adjacent region.

With such a measurement method, the structure of an oxide semiconductor having a plurality of structures can be analyzed in some cases.

The oxide semiconductor may be a stack of oxide semiconductors. For example, the oxide semiconductor may have a two-layer structure or a three-layer structure.

Figure 1C:
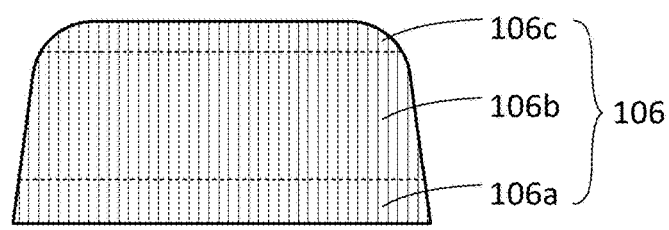

For example, the case where the oxide semiconductor has a three-layer structure is described with reference to FIG. 1C.

For an oxide semiconductor layer 106b (middle layer), the description of the above-described oxide semiconductor can be referred to. An oxide semiconductor layer 106a (bottom layer) and an oxide semiconductor layer 106c (top layer)

include one or more elements other than oxygen included in the oxide semiconductor layer 106b. Since the oxide semiconductor layer 106a and the oxide semiconductor layer 106c each include one or more elements other than oxygen included in the oxide semiconductor layer 106b, an interface state is less likely to be formed at the interface between the oxide semiconductor layer 106a and the oxide semiconductor layer 106b and the interface between the oxide semiconductor layer 106b and the oxide semiconductor layer 106c.

In the case of using an In-M-Zn oxide as the oxide semiconductor layer 106a, when summation of In and M is assumed to be 100 atomic %, the proportions of In and M are preferably set to be less than 50 atomic % and greater than or equal to 50 atomic %, respectively, further preferably less than 25 atomic % and greater than or equal to 75 atomic %, respectively. In the case of using an In-M-Zn oxide as the oxide semiconductor layer 106b, when summation of In and M is assumed to be 100 atomic %, the proportions of In and M are preferably set to be greater than or equal to 25 atomic % and less than 75 atomic %, respectively, further preferably greater than or equal to 34 atomic % and less than 66 atomic %, respectively. In the case of using an In-M-Zn oxide as the oxide semiconductor layer 106c, when summation of In and M is assumed to be 100 atomic %, the proportions of In and M are preferably set to be less than 50 atomic % and greater than or equal to 50 atomic %, respectively, further preferably less than 25 atomic % and greater than or equal to 75 atomic %, respectively. Note that the oxide semiconductor layer 106c may be an oxide that is a type the same as that of the oxide semiconductor layer 106a.

Here, in some cases, there is a mixed region of the oxide semiconductor layer 106a and the oxide semiconductor layer 106b between the oxide semiconductor layer 106a and the oxide semiconductor layer 106b. Furthermore, in some cases, there is a mixed region of the oxide semiconductor layer 106b and the oxide semiconductor layer 106c between the oxide semiconductor layer 106b and the oxide semiconductor layer 106c. The mixed region has a low interface state density. For that reason, the stack of the oxide semiconductor layer 106a, the oxide semiconductor layer 106b, and the oxide semiconductor layer 106c has a band structure where energy at each interface and in the vicinity of the interface is changed continuously (continuous junction).

As the oxide semiconductor layer 106b, an oxide having an electron affinity higher than those of the oxide semiconductor layers 106a and 106c is used. For example, as the oxide semiconductor layer 106b, an oxide having an electron affinity higher than those of the oxide semiconductor layers 106a and 106c by 0.07 eV or higher and 1.3 eV or lower, preferably 0.1 eV or higher and 0.7 eV or lower, more preferably 0.15 eV or higher and 0.4 eV or lower is used. Note that the electron affinity refers to an energy difference between the vacuum level and the bottom of the conduction band.

At this time, when an electric field is applied to a gate electrode, a channel is formed in the oxide semiconductor layer 106b having the highest electron affinity in the oxide semiconductor layer 106a, the oxide semiconductor layer 106b, and the oxide semiconductor layer 106c.

Moreover, the thickness of the oxide semiconductor layer 106c is preferably as small as possible to increase the on-state current of the transistor. The thickness of the oxide semiconductor layer 106c is set to be less than 10 nm, preferably less than or equal to 5 nm, further preferably less than or equal to 3 nm, for example. Meanwhile, the oxide semiconductor layer 106c has a function of blocking elements other than oxygen (such as silicon) included in the adjacent insulating film from entering the oxide semiconductor layer 106b where a channel is formed. For this reason, it is preferable that the oxide semiconductor layer 106c have a certain thickness. The thickness of the oxide semiconductor layer 106c is set to be greater than or equal to 0.3 nm, preferably greater than or equal to 1 nm, further preferably greater than or equal to 2 nm, for example.

To improve reliability, preferably, the thickness of the oxide semiconductor layer 106a is large and the thickness of the oxide semiconductor layer 106c is small. Specifically, the thickness of the oxide semiconductor layer 106a is set to be greater than or equal to 20 nm, preferably greater than or equal to 30 nm, further preferably greater than or equal to 40 nm, still further preferably greater than or equal to 60 nm. With the oxide semiconductor layer 106a having a thickness greater than or equal to 20 nm, preferably greater than or equal to 30 nm, further preferably greater than or equal to 40 nm, still further preferably greater than or equal to 60 nm, the distance from the interface between the adjacent insulating film and the oxide semiconductor layer 106a to the oxide semiconductor layer 106b where the channel is formed can be greater than or equal to 20 nm, preferably greater than or equal to 30 nm, further preferably greater than or equal to 40 nm, still further preferably greater than or equal to 60 nm. Note that since the productivity of a semiconductor device might be reduced, the thickness of the oxide semiconductor layer 106a is set to be less than or equal to 200 nm, preferably less than or equal to 120 nm, further preferably less than or equal to 80 nm.

For example, the concentration of silicon in a region between the oxide semiconductor layer 106b and the oxide semiconductor layer 106a measured by SIMS is set to be lower than $1\times10^{19}$ atoms/cm$^3$, preferably lower than $5\times10^{18}$ atoms/cm$^3$, further preferably lower than $2\times10^{18}$ atoms/cm$^3$. The concentration of silicon in a region between the oxide semiconductor layer 106b and the oxide semiconductor layer 106c measured by SIMS is set to be lower than $1\times10^{19}$ atoms/cm$^3$, preferably lower than $5\times10^{18}$ atoms/cm$^3$, further preferably lower than $2\times10^{18}$ atoms/cm$^3$.

It is preferable to reduce the concentration of hydrogen in the oxide semiconductor layer 106a and the oxide semiconductor layer 106c in order to reduce the concentration of hydrogen in the oxide semiconductor layer 106b. The concentration of hydrogen in the oxide semiconductor layer 106a and the oxide semiconductor layer 106c measured by SIMS is set to be lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$. It is preferable to reduce the concentration of nitrogen in the oxide semiconductor layer 106a and the oxide semiconductor layer 106c in order to reduce the concentration of nitrogen in the oxide semiconductor layer 106b. The concentration of nitrogen in the oxide semiconductor layer 106a and the oxide semiconductor layer 106c measured by SIMS is set to be lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

The above three-layer structure is an example of the oxide semiconductor. For example, a two-layer structure without the oxide semiconductor layer 106a or the oxide semiconductor layer 106c may be employed.

Figure 4A:
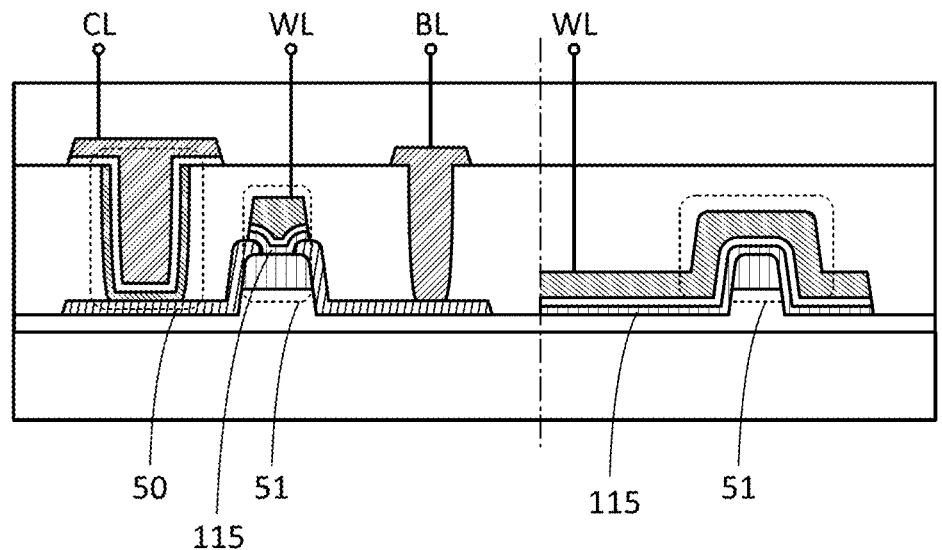
FIGS. 4A and 4B are each a cross-sectional view illustrating an example of a semiconductor device of one embodiment of the present invention.

As illustrated in FIG. 4A, an oxide semiconductor layer 115 may be provided between the semiconductor 106 and the insulating film 112. In other words, the oxide semiconductor layer 115 includes a region in contact with the top surface of the semiconductor 106 and a region in contact with the side surface of the semiconductor 106 in the channel width direction. The oxide semiconductor layer 115 includes the region in contact with the side surface of the semiconductor 106, whereby the side surface of the semiconductor 106 can be protected. In this case, the interface state density in the side surface of the semiconductor 106 can be decreased compared to the case where the oxide semiconductor layer 115 is not provided. Accordingly, with the oxide semiconductor layer 115, variation in the electrical characteristics of the transistor can be suppressed, so that the semiconductor device can be highly reliable. Description of the oxide semiconductor layer 106c is referred to for the oxide semiconductor layer 115.

<Modification of Structure Example 1 of Semiconductor Device>

Figure 5:
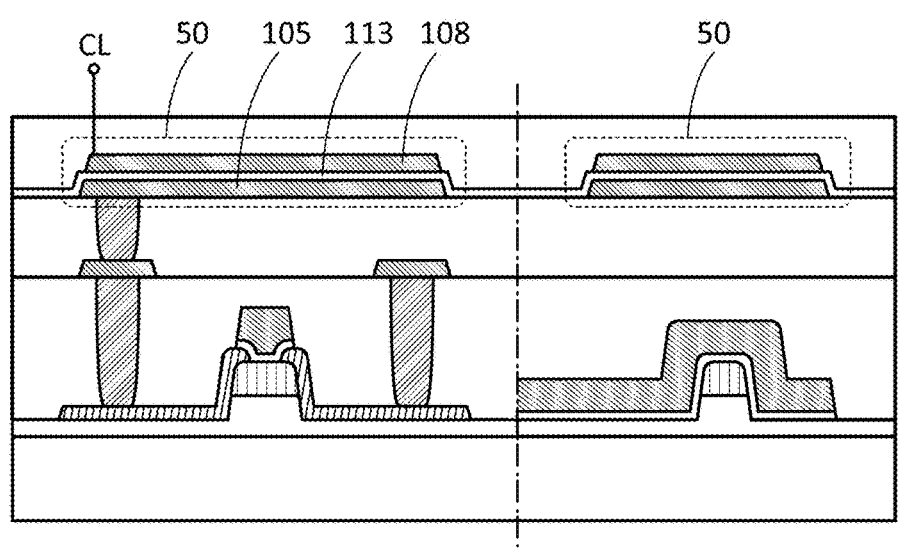
FIG. 5 is a cross-sectional view illustrating an example of a semiconductor device of one embodiment of the present invention.

FIG. 5 illustrates a modification example of the semiconductor device in FIG. 1B.

Specifically, the semiconductor device in FIG. 5 is different from the semiconductor device in FIG. 1B in the structure of the capacitor 50.

The capacitor 50 in FIG. 5 overlaps with the transistor 51 and includes the conductive film 105 electrically connected to the conductive film 116a, the insulating film 113 in contact with the conductive film 105, and the conductive film 108 facing the conductive film 105 with the insulating film 113 therebetween. The conductive film 105 serves as the one of electrodes of the capacitor 50. The conductive film 108 serves as the other of electrodes of the capacitor 50.

The capacitor 50 overlaps with the transistor 51. Therefore, the capacitance of the capacitor 50 can be increased without an increase in an area occupied by the semiconductor device compared to the case where a capacitor is formed in the same layer as the transistor 51. In other words, an area occupied by the capacitor 50 can be substantially made small for the required capacitance.

Since the area occupied by the semiconductor device including the transistor 51 and the capacitor 50 is small, the semiconductor device can be highly integrated.

Figure 4B:
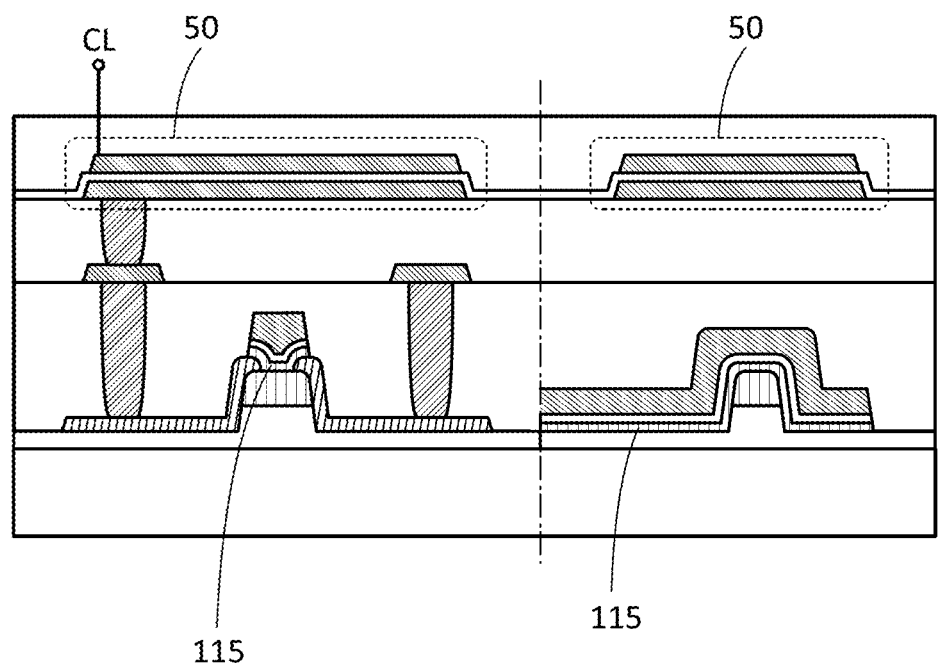

Note that as illustrated in FIG. 4B, the oxide semiconductor layer 115 may be provided between the semiconductor 106 and the insulating film 112.

<Structural Example 2 of Semiconductor Device>

Figure 6A:
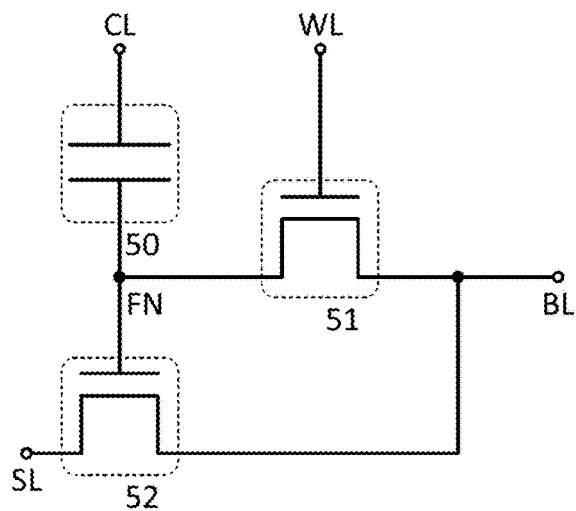
FIGS. 6A and 6B are a circuit diagram and a cross-sectional view illustrating an example of a semiconductor device of one embodiment of the present invention.

FIG. 6A is an example of a circuit diagram of a semiconductor device of one embodiment of the present invention.

The semiconductor device in FIG. 6A is the same as the semiconductor device in FIG. 1A in that the capacitor 50, the transistor 51, the wiring BL, the wiring WL, and the wiring CL are provided. The connection relations thereof are also the same. The semiconductor device in FIG. 6A is different from the semiconductor device in FIG. 1A in that a wiring SL and a transistor 52 are provided.

One of a source and a drain of the transistor 52 is electrically connected to the wiring BL, the other of the source and the drain thereof is electrically connected to the wiring SL, and a gate thereof is electrically connected to the node FN.

Accordingly, in the semiconductor device in FIG. 6A, a potential based on a potential of the wiring BL is supplied to the node FN at the time when the transistor 51 is in a conduction state. The semiconductor device in FIG. 6A also has a function of holding the potential of the node FN at the time when the transistor 51 is in a non-conduction state. In other words, the semiconductor device in FIG. 6A has a function of a memory cell of a memory device, which is similar to the feature of the semiconductor device in FIG. 1A.

Conduction and non-conduction states of the transistor 51 can be controlled by the potential supplied to the wiring WL. A transistor with small off-state current is used as the transistor 51, whereby the potential of the node FN at the time when the transistor 51 is in a non-conduction state can be held for a long time. Therefore, the frequency of refresh operations of the semiconductor device can be reduced, and power consumption of the semiconductor device can be reduced. A transistor including an oxide semiconductor is given as an example of a transistor with small off-state current.

A constant potential such as a ground potential is supplied to the wiring CL. At this time, the apparent threshold voltage of the transistor 52 varies depending on the potential of the node FN. Conduction and non-conduction states of the transistor 52 are changed in response to variation in the apparent threshold voltage; thus, data can be read.

The semiconductor devices of FIG. 6A are arranged in a matrix, so that a memory device (memory cell array) can be formed.

Figure 6B:
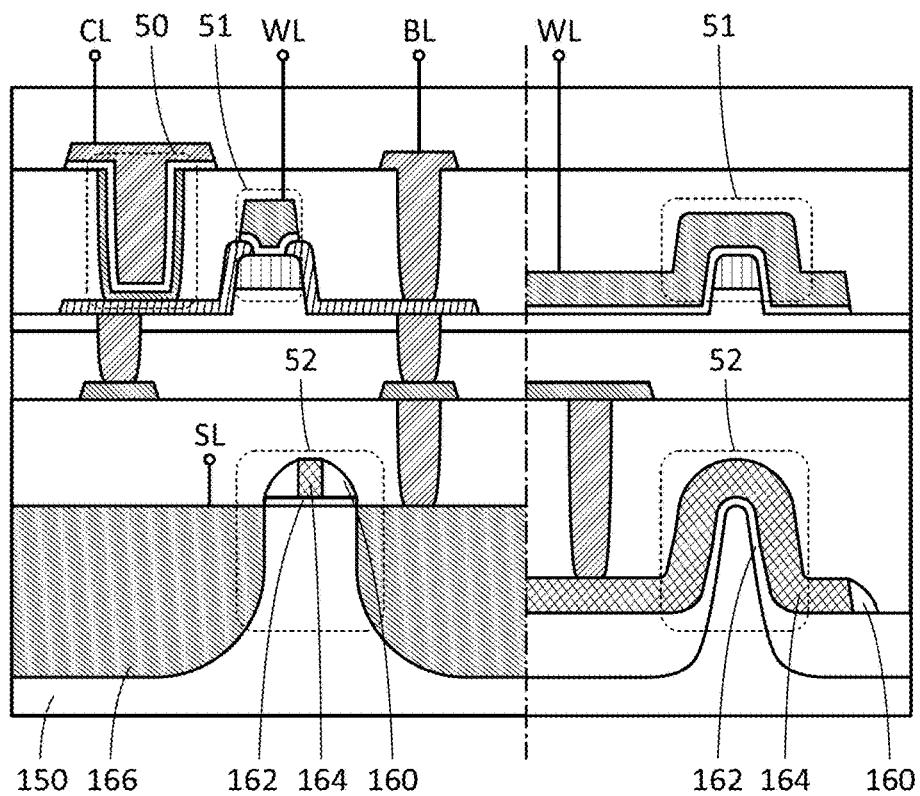

FIG. 6B is an example of a cross-sectional view corresponding to the semiconductor device in FIG. 6A.

The semiconductor device in FIG. 6B is the same as the semiconductor device in FIG. 1B in that the transistor 51 and the capacitor 50 are provided. The description of FIG. 1B is referred to for the transistor 51 and the capacitor 50.

The semiconductor device in FIG. 6B is different from the semiconductor device in FIG. 1B in that the transistor 52 is provided.

The transistor 52 in FIG. 6B is formed using a semiconductor substrate 150. The transistor 52 includes a projection of the semiconductor substrate 150, impurity regions 166 in the projection, an insulating film 162 including a region in contact with a top surface and a side surface of the projection, a conductive film 164 facing the top surface and the side surface of the projection with the insulating film 162 provided therebetween, and an insulating film 160 in contact with a side surface of the conductive film 164. The conductive film 164 serves as a gate electrode of the transistor 52.

The impurity regions 166 serve as a source region and a drain region of the transistor 52. The transistor 52 does not necessarily include the insulating film 160. The transistor 52 is also referred to as a FIN-type transistor because it utilizes the projection of the semiconductor substrate 150. An insulating film may be provided over the projection of the semiconductor substrate 150. The insulating film serves as a mask at the time when the projection is formed.

Note that here is shown an example in which the semiconductor substrate 150 includes the projection; however, a semiconductor device of one embodiment of the present invention is not limited thereto. For example, a semiconductor region having a projection may be formed by processing an SOI substrate.

The transistor 52 may be either an n-channel transistor or a p-channel transistor, and an appropriate transistor is used in accordance with a circuit.

For the semiconductor substrate 150, a semiconductor having an energy gap different from that of the semiconductor 106 may be used. For example, a semiconductor other than an oxide semiconductor may be used for the semiconductor substrate 150 and an oxide semiconductor may be used for the semiconductor 106. In the case where single crystal silicon is used for the semiconductor substrate, the transistor 52 can operate at high speed. In the case where an oxide semiconductor is used for the semiconductor 106, the transistor 51 can have small off-state current.

In the semiconductor device in FIG. 6B, the transistor 51 is provided over the transistor 52 with an insulating film provided therebetween. Between the transistor 52 and the transistor 51, a plurality of conductive films which serve as wirings are provided. Wirings and electrodes provided in an upper layer and a lower layer are electrically connected to each other by a plurality of conductive films embedded in insulating films.

Thus, a plurality of transistors is stacked, so that the degree of integration of the semiconductor device can be increased.

<Modification of Structure Example 2 of Semiconductor Device>

Figure 7:
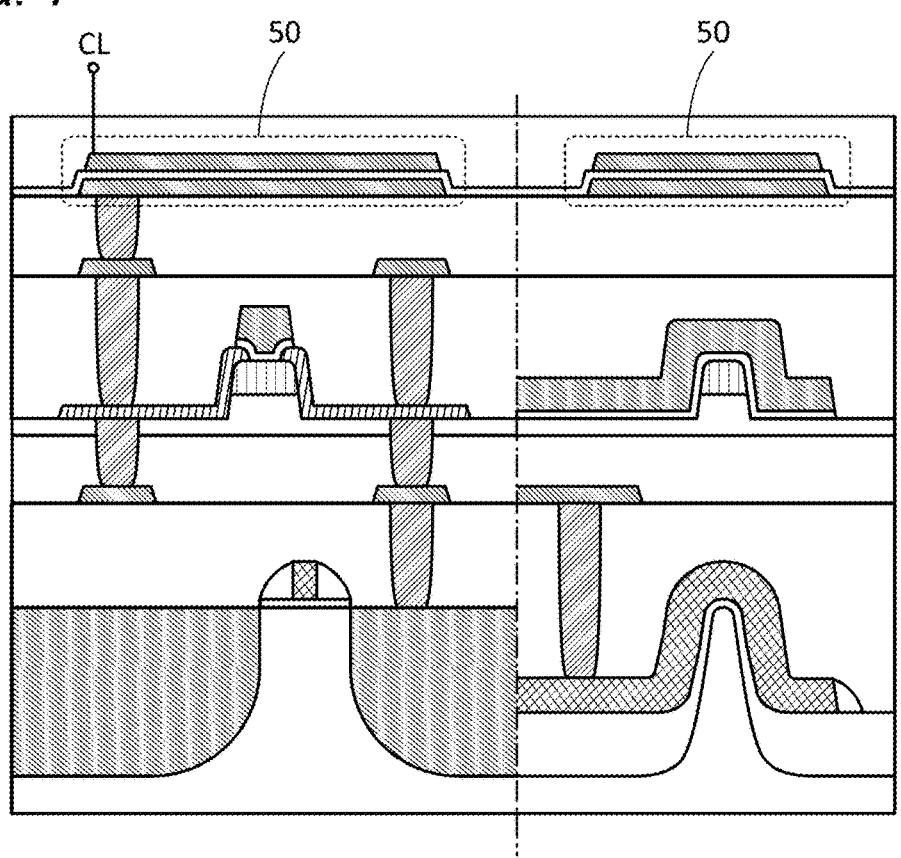
FIG. 7 is a cross-sectional view illustrating an example of a semiconductor device of one embodiment of the present invention.

FIG. 7 illustrates a modification example of the semiconductor device in FIG. 6B.

Specifically, the semiconductor device in FIG. 7 is different from the semiconductor device in FIG. 6B in the structure of the capacitor 50.

The capacitor 50 in FIG. 7 overlaps with the transistor 51 and includes the conductive film 105 electrically connected to the conductive film 116a, the insulating film 113 in contact with the conductive film 105, and the conductive film 108 facing the conductive film 105 with the insulating film 113 therebetween. The conductive film 105 serves as the one of electrodes of the capacitor 50. The conductive film 108 serves as the other of electrodes of the capacitor 50.

The capacitor 50 overlaps with the transistor 51. Therefore, the capacitance of the capacitor 50 can be increased without an increase in an area occupied by the semiconductor device compared to the case where a capacitor is formed in the same layer as the transistor 51. In other words, an area occupied by the capacitor 50 can be substantially made small for the required capacitance.

Since the area occupied by the semiconductor device including the transistor 51 and the capacitor 50 is small, the semiconductor device can be highly integrated.

In the case where single crystal silicon is used for the semiconductor substrate 150, the concentration of hydrogen in the insulating film in the vicinity of the semiconductor substrate 150 is preferably high. The hydrogen terminates dangling bonds of silicon, so that the reliability of the transistor 52 can be increased. In contrast, in the case where an oxide semiconductor is used for the semiconductor 106 of the transistor 51, the concentration of hydrogen in the insulating film in the vicinity of the semiconductor 106 of the transistor 51 is preferably low. The hydrogen causes generation of carriers in an oxide semiconductor, which might lead to a decrease in the reliability of the transistor 51. Therefore, in the case where the transistor 52 including single crystal silicon and the transistor 51 including an oxide semiconductor are stacked, providing an insulating film 103 having a function of blocking hydrogen between the transistors is effective because the reliability of the transistors can be increased (see FIGS. 8A and 8B).

The insulating film 103 may be, for example, formed to have a single-layer structure or a stacked-layer structure using an insulating film containing aluminum oxide, aluminum oxynitride, gallium oxide, gallium oxynitride, yttrium oxide, yttrium oxynitride, hafnium oxide, hafnium oxynitride, yttria-stabilized zirconia (YSZ), or the like.

Figure 8A:
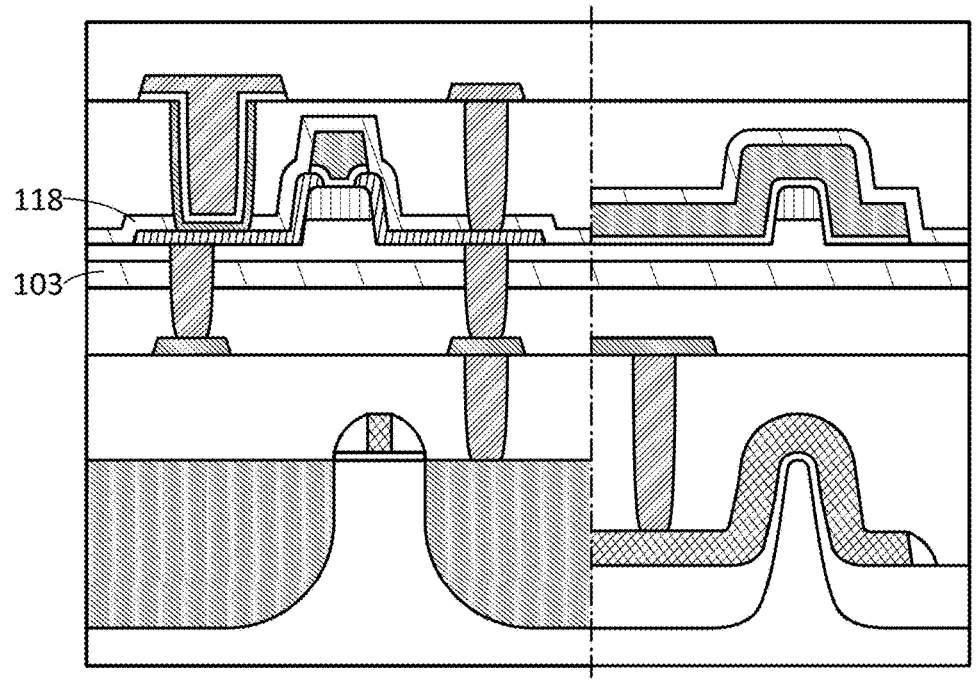
FIGS. 8A and 8B are each a cross-sectional view illustrating an example of a semiconductor device of one embodiment of the present invention.
Figure 8B:
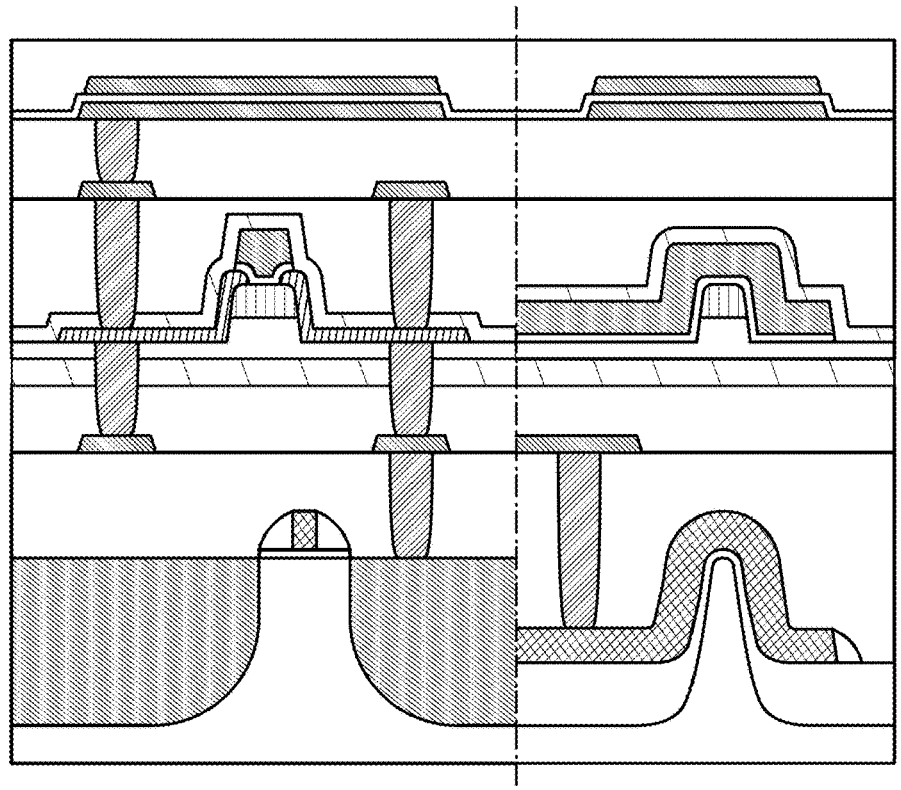

Further, an insulating film 118 having a function of blocking hydrogen is preferably formed over the transistor 51 to cover the transistor 51 using an oxide semiconductor (see FIGS. 8A and 8B). As the insulating film 118, an insulating film that is similar to the insulating film 103 can be used, and in particular, an aluminum oxide film is preferably used. The aluminum oxide film has a high blocking effect of preventing penetration of both oxygen and impurities such as hydrogen and moisture. Thus, by using the aluminum oxide film as the insulating film 118 covering the transistor 51, release of oxygen from the oxide semiconductor included in the transistor 51 can be prevented and entry of water and hydrogen into the oxide semiconductor can be prevented.

Figure 9A:
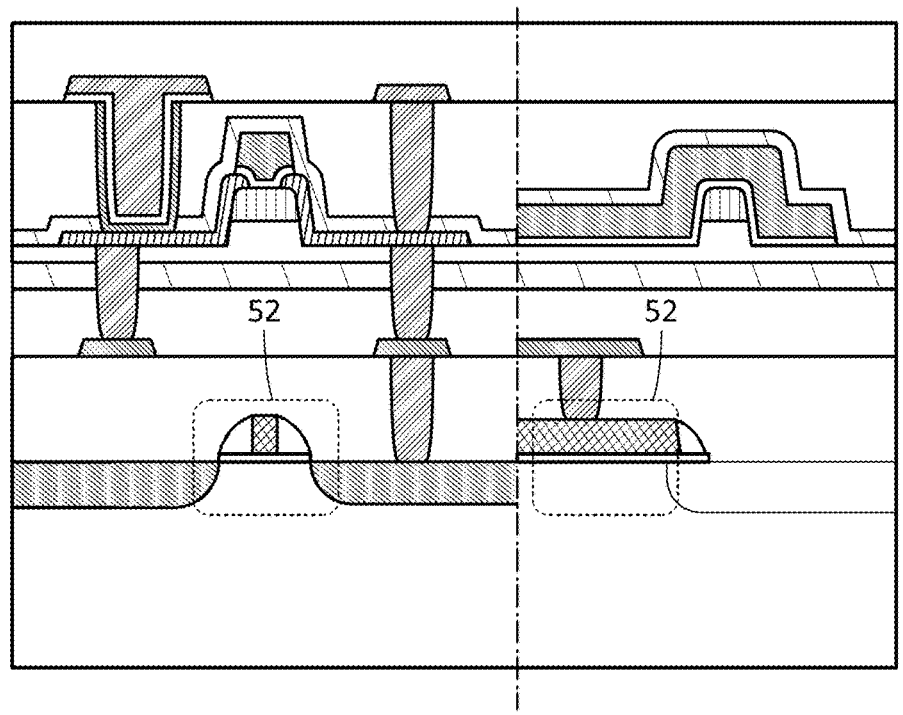
FIGS. 9A and 9B are each a cross-sectional view illustrating an example of a semiconductor device of one embodiment of the present invention.
Figure 9B:
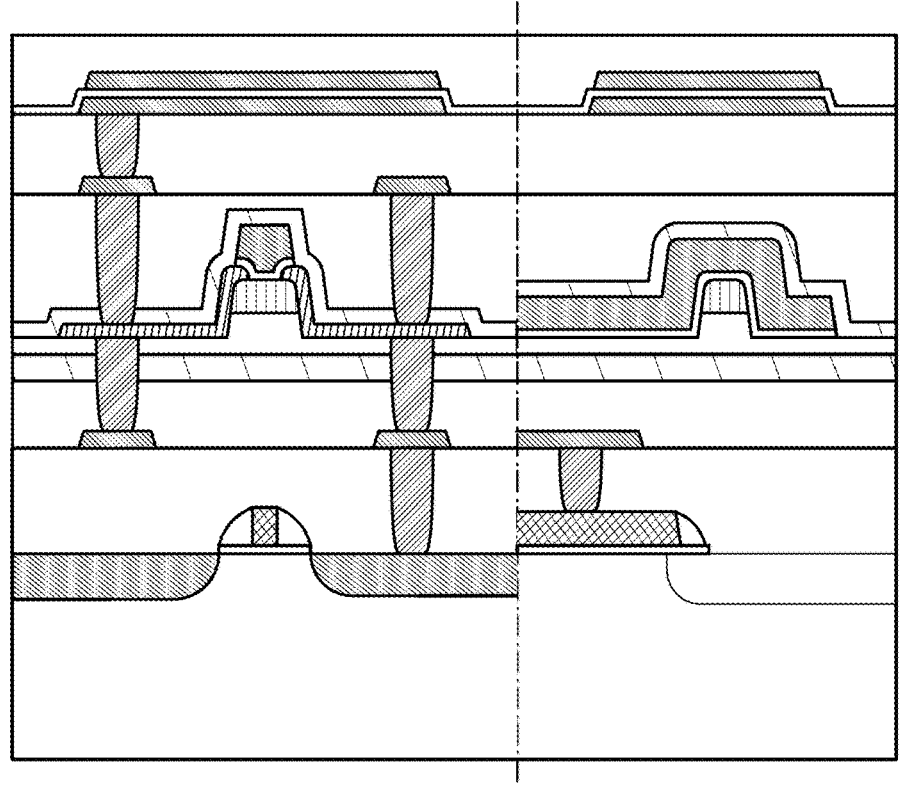

Note that the transistor 52 can be any of various types of transistors without being limited to a FIN-type transistor. For example, a planar type transistor or the like can be employed (see FIGS. 9A and 9B).

Figure 10A:
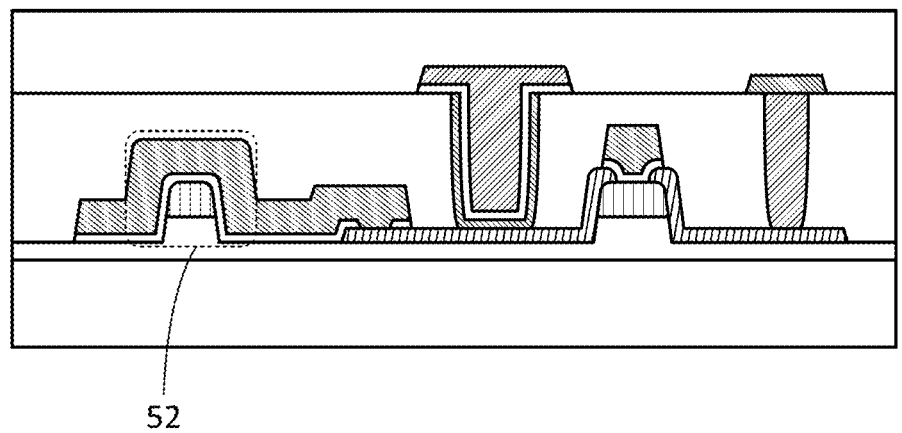
FIGS. 10A and 10B are each a cross-sectional view illustrating an example of a semiconductor device of one embodiment of the present invention.
Figure 10B:
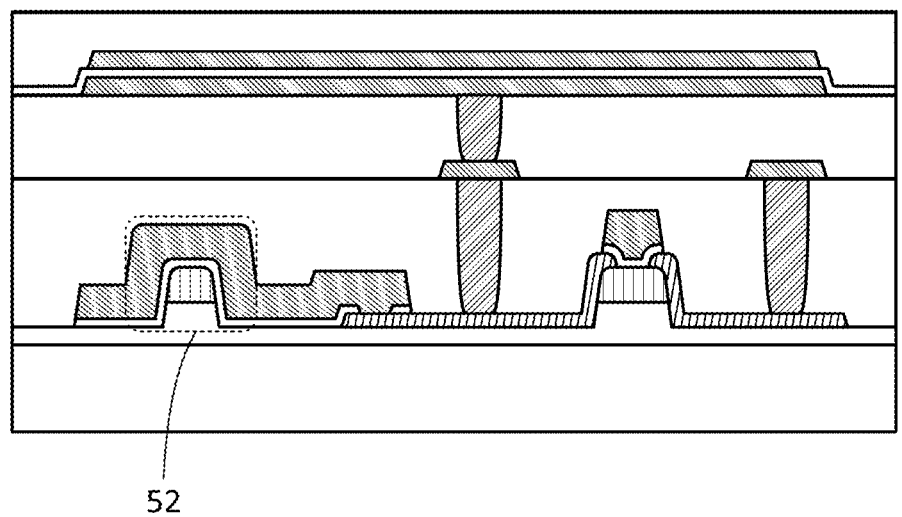

The transistor 52 may be formed on the same surface as the transistor 51 (see FIGS. 10A and 10B). In that case, the semiconductor of the transistor 52 can be formed through the same steps as the semiconductor 106 of the transistor 51. Furthermore, other components of the transistor 52 can be formed through the same steps as counterparts of the transistor 51. In this case, the transistor 51 and the transistor 52 can be formed through the same steps. In other words, the number of manufacturing steps of the semiconductor device can be reduced compared to the case where the transistor 51 and the transistor 52 are formed through different steps, leading to an increase in the productivity of the semiconductor device.

<Structure Example 3 of Semiconductor Device>

Figure 11:
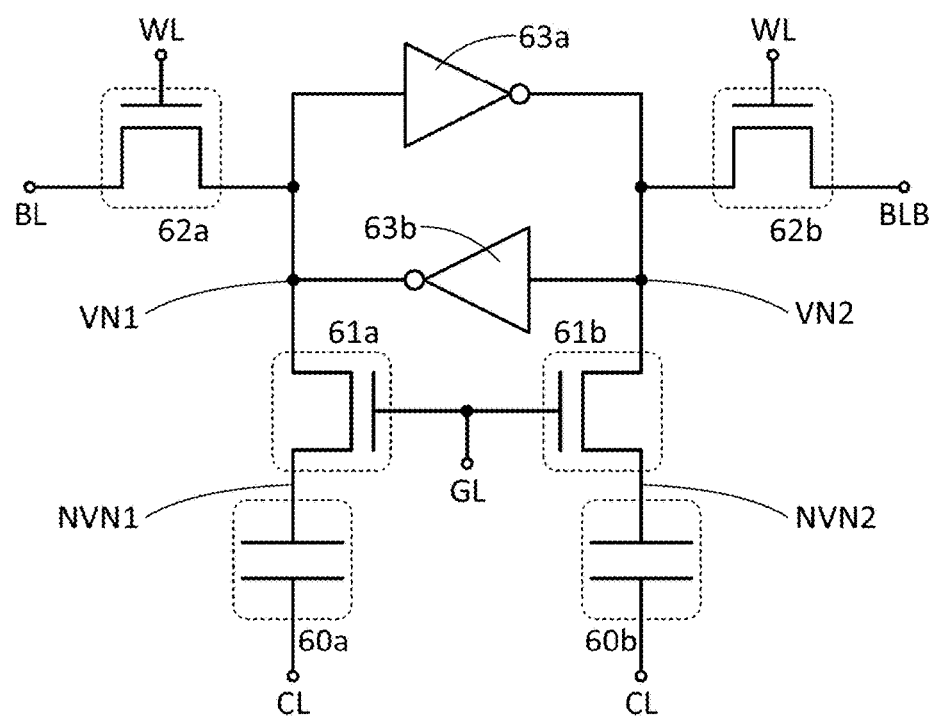
FIG. 11 is a circuit diagram illustrating an example of a semiconductor device of one embodiment of the present invention.

FIG. 11 is an example of a circuit diagram of a semiconductor device of one embodiment of the present invention.

The semiconductor device in FIG. 11 includes a capacitor 60a, a capacitor 60b, a transistor 61a, a transistor 61b, a transistor 62a, a transistor 62b, an inverter 63a, an inverter 63b, a wiring BL, a wiring BLB, a wiring WL, a wiring CL, and a wiring GL.

The semiconductor device in FIG. 11 is a memory cell in which the inverter 63a and the inverter 63b are connected in a ring to form a flip-flop. A node to which an output signal of the inverter 63b is output is a node VN1, and a node to which an output signal of the inverter 63a is output is a node VN2. The memory cells are provided in a matrix, whereby a memory device (memory cell array) can be formed.

One of a source and a drain of the transistor 62a is electrically connected to the wiring BL, the other of the source and the drain thereof is electrically connected to the node VN1, and a gate thereof is electrically connected to the wiring WL. One of a source and a drain of the transistor 62b is electrically connected to the node VN2, the other of the source and the drain thereof is electrically connected to the wiring BLB, and a gate thereof is electrically connected to the wiring WL.

One of a source and a drain of the transistor 61a is electrically connected to the node VN1, the other of the source and the drain thereof is electrically connected to one of electrodes of the capacitor 60a, and a gate thereof is electrically connected to the wiring GL. A node between the other of the source and the drain of the transistor 61a and the one of electrodes of the capacitor 60a is a node NVN1. One of a source and a drain of the transistor 61b is electrically connected to the node VN2, the other of the source and the drain thereof is electrically connected to one of electrodes of the capacitor 60b, and a gate thereof is electrically connected to the wiring GL. A node between the other of the source and the drain of the transistor 61b and the one of electrodes of the capacitor 60b is a node NVN2.

The other of electrodes of the capacitor 60a is electrically connected to the wiring CL. The other of electrodes of the capacitor 60b is electrically connected to the wiring CL.

Conduction and non-conduction states of the transistor 62a and the transistor 62b can be controlled by a potential supplied to the wiring WL. Conduction and non-conduction states of the transistor 61a and the transistor 61b can be controlled by a potential supplied to the wiring GL.

Writing, retaining, and reading operation of the memory cell illustrated in FIG. 11 will be described below.

In the case where data is written, first, potentials corresponding to data 0 or data 1 are applied to the wiring BL and the wiring BLB.

For example, in the case where data 1 is to be written, a high-level power supply potential (VDD) is applied to the wiring BL and a ground potential is applied to the wiring BLB. Then, a potential (VH) higher than or equal to the sum of VDD and the threshold voltage of the transistors 62a and 62b is applied to the wiring WL.

Next, the potential of the wiring WL is set to be lower than the threshold voltage of the transistors 62a and 62b, whereby the data 1 written to the flip-flop is retained.

In the case where the data is read, first, the wiring BL and the wiring BLB are set to VDD in advance. Then, VH is applied to the wiring WL. Accordingly, the potential of the wiring BL remains VDD, but the potential of the wiring BLB is discharged through the transistor 62a and the inverter 63a to be a ground potential. The potential difference between the wiring BL and the wiring BLB is amplified by a sense amplifier (not illustrated), so that the retained data 1 can be read.

In the case where data 0 is to be written, the wiring BL is set to a ground potential and the wiring BLB is set to VDD; then, VH is applied to the wiring WL. Next, the potential of the wiring WL is set to be lower than the threshold voltage of the transistors 62a and 62b, whereby the data 0 written to the flip-flop is retained. In the case of data reading, the wiring BL and the wiring BLB are set to VDD in advance and VH is applied to the wiring WL, whereby the potential of the wiring BLB remains VDD but the potential of the wiring BL is discharged through the transistor 62b and the inverter 63b to be a ground potential. The potential difference between the wiring BL and the wiring BLB is amplified by the sense amplifier, so that the retained data 0 can be read.

Accordingly, the semiconductor device in FIG. 11 serves as a so-called static random access memory (SRAM). Unlike the semiconductor devices in FIG. 1A and FIG. 6A, an SRAM does not require refresh operation because the SRAM retains data using a flip-flop. Therefore, power consumption in retaining data can be reduced. In addition, an SRAM does not require a capacitor in a flip-flop and is therefore suitable for applications where high speed operation is required.

In the semiconductor device in FIG. 11, data of the node VN1 can be written to the node NVN1 through the transistor 61a. Similarly, data of the node VN2 can be written to the node NVN2 through the transistor 61b. The written data is retained by turning off the transistor 61a or the transistor 61b. For example, even in the case where supply of a power supply potential is stopped, data of the node VN1 and the node VN2 can be retained in some cases.

Unlike a conventional SRAM in which data is lost immediately after supply of a power supply potential is stopped, the semiconductor device in FIG. 11 can retain data even after supply of a power supply potential is stopped. Therefore, power consumption of the semiconductor device can be reduced by turning on or off a source as appropriate. For example, the semiconductor device in FIG. 11 is used in a memory region of a CPU, whereby power consumption of the CPU can be reduced.

Note that the length of a period during which data is retained in the node NVN1 and the node NVN2 depends on the off-state current of the transistor 61a and the transistor 61b. Therefore, a transistor with small off-state current is preferably used as each of the transistor 61a and the transistor 61b in order to retain data for a long time. In addition, the capacitance of the capacitor 60a and the capacitor 60b is preferably increased.

For example, the transistor 51 and the capacitor 50 in FIGS. 1A and 1B or FIG. 5 are used as the transistor 61a and the capacitor 60a, whereby data can be retained in the node NVN1 for a long time. Similarly, the transistor 51 and the capacitor 50 in FIGS. 1A and 1B are used as the transistor 61b and the capacitor 60b, whereby data can be retained in the node NVN2 for a long time. Accordingly, the description of the transistor 51 is referred to for the transistor 61a and the transistor 61b. Furthermore, the description of the capacitor 50 is referred to for the capacitor 60a and the capacitor 60b.

As described with reference to FIGS. 6A and 6B, FIG. 7, FIGS. 8A and 8B, and FIGS. 9A and 9B, the transistor 51 and the capacitor 50 in FIGS. 1A and 1B and FIG. 5 can be formed to at least partly overlap with the transistor 52. The transistor 62a, the transistor 62b, a transistor included in the inverter 63a, and a transistor included in the inverter 63b in FIG. 11 can each be formed to overlap with at least part of any of the transistor 61a, the transistor 61b, the capacitor 60a, and the capacitor 60b. Accordingly, the semiconductor device in FIG. 11 can be formed without a significant increase in an occupation area in some cases as compared to a conventional SRAM. The description of the transistor 52 is referred to for the transistor 62a, the transistor 62b, the transistor included in the inverter 63a, and the transistor included in the inverter 63b.

As described above, the semiconductor device of one embodiment of the present invention has high performance for an occupation area. Furthermore, the semiconductor device can be manufactured with high productivity.

<CPU>

Figure 12:
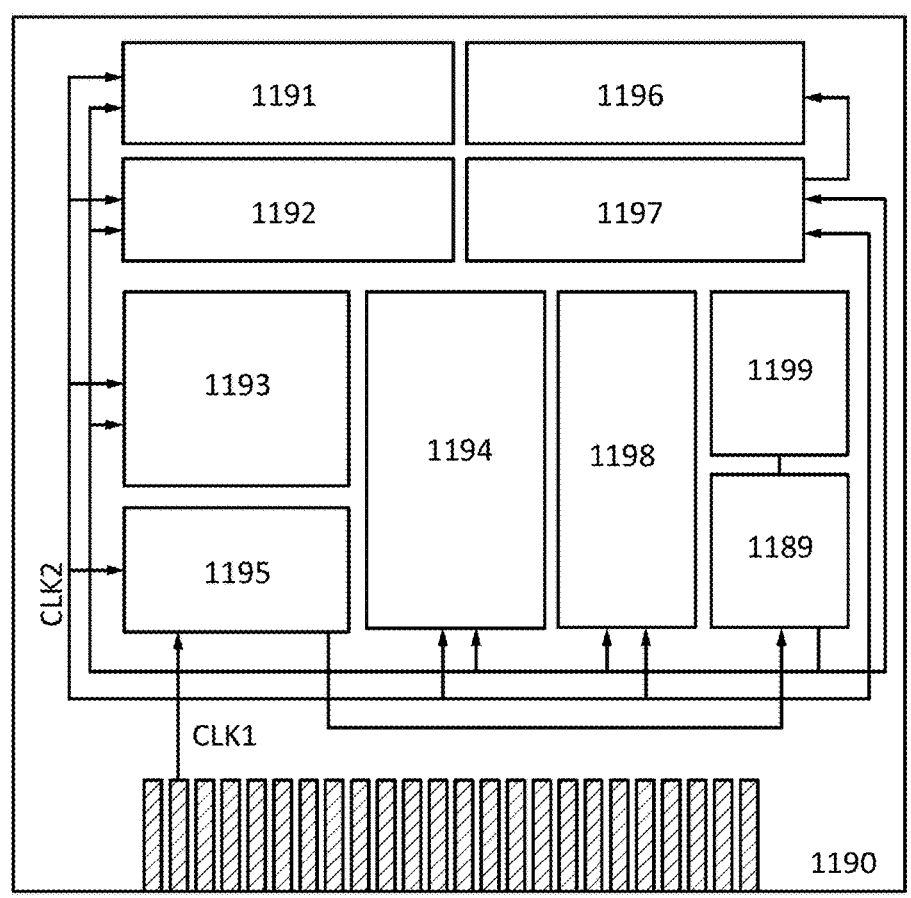
FIG. 12 is a block diagram illustrating a CPU of one embodiment of the present invention.

A CPU including the above-described semiconductor device is described below. FIG. 12 is a block diagram illustrating a configuration example of a CPU including any of the above-described transistors as a component.

The CPU illustrated in FIG. 12 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198 (Bus I/F), a rewritable ROM 1199, and a ROM interface 1189 (ROM I/F). A semiconductor substrate, an SOI substrate, a glass substrate, or the like is used as the substrate 1190. The ROM 1199 and the ROM interface 1189 may be provided over a separate chip. Needless to say, the CPU in FIG. 12 is just an example in which the configuration has been simplified, and an actual CPU may have a variety of configurations depending on the application. For example, the CPU may have the following configuration: a structure including the CPU illustrated in FIG. 12 or an arithmetic circuit is considered as one core; a plurality of the cores is included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the internal clock signal CLK2 to the above circuits.

In the CPU illustrated in FIG. 12, a memory cell is provided in the register 1196. For the memory cell of the register 1196, any of the above-described transistors, the above-described memory device, or the like can be used.

In the CPU illustrated in FIG. 12, the register controller 1197 selects operation of retaining data in the register 1196 in accordance with an instruction from the ALU 1191. That is, the register controller 1197 selects whether data is retained by a flip-flop or by a capacitor in the memory cell included in the register 1196. When data retaining by the flip-flop is selected, a power supply voltage is supplied to the memory cell in the register 1196. When data retaining by the capacitor is selected, the data is rewritten in the capacitor, and supply of power supply voltage to the memory cell in the register 1196 can be stopped.

Figure 13:
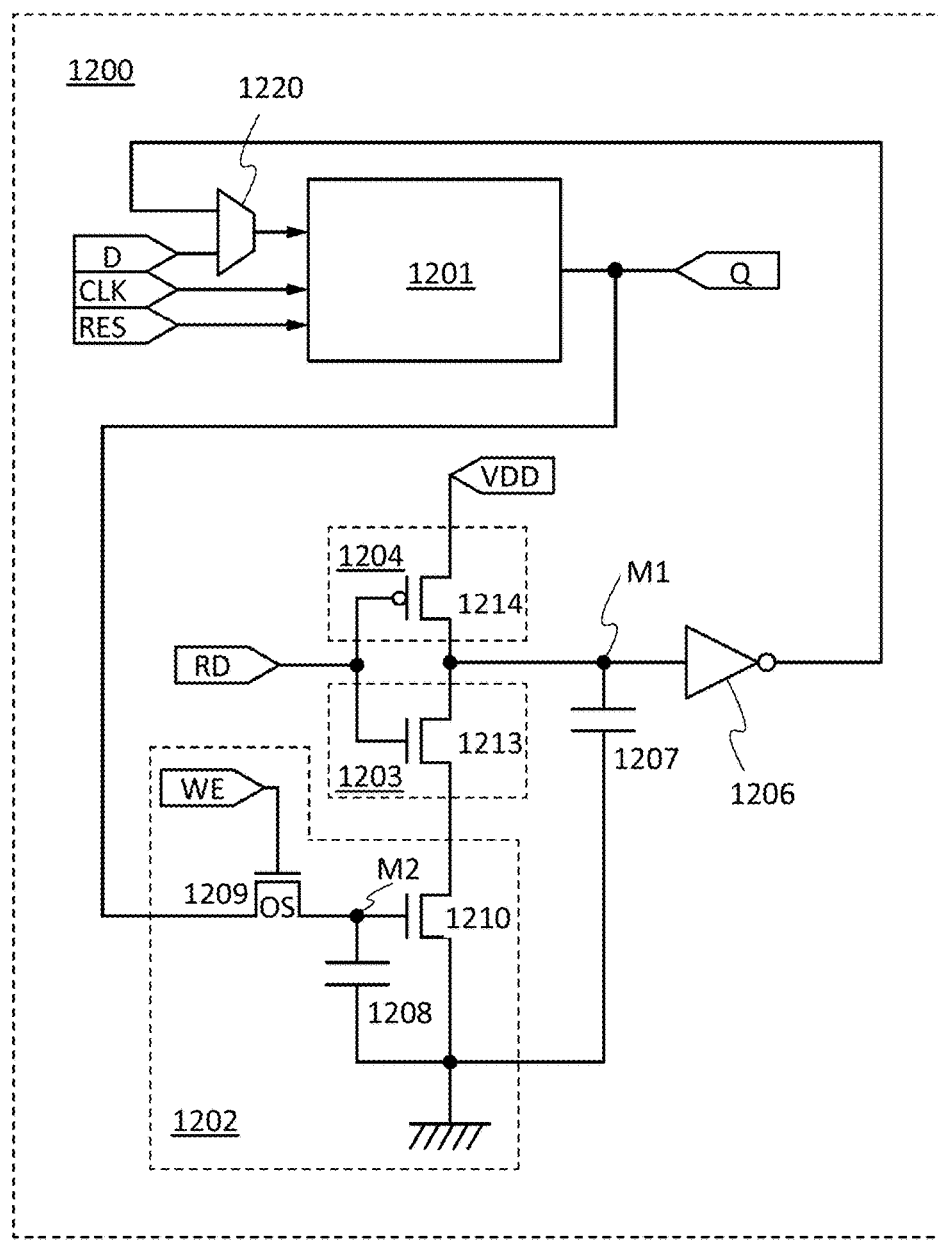
FIG. 13 is a circuit diagram of a memory element of one embodiment of the present invention.

FIG. 13 is an example of a circuit diagram of a memory element that can be used as the register 1196. A memory element 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory element 1200 may further include another element such as a diode, a resistor, or an inductor, as needed.

Here, the above-described memory device can be used as the circuit 1202. When supply of a power supply voltage to the memory element 1200 is stopped, a ground potential (0 V) or a potential at which the transistor 1209 in the circuit 1202 is turned off continues to be input to a gate of the transistor 1209. For example, the gate of the transistor 1209 is grounded through a load such as a resistor.

Shown here is an example in which the switch 1203 is a transistor 1213 having one conductivity type (e.g., an n-channel transistor) and the switch 1204 is a transistor 1214 having a conductivity type opposite to the one conductivity type (e.g., a p-channel transistor). A first terminal of the switch 1203 corresponds to one of a source and a drain of the transistor 1213, a second terminal of the switch 1203 corresponds to the other of the source and the drain of the transistor 1213, and conduction or non-conduction between the first terminal and the second terminal of the switch 1203 (i.e., the on/off state of the transistor 1213) is selected by a control signal RD input to a gate of the transistor 1213. A first terminal of the switch 1204 corresponds to one of a source and a drain of the transistor 1214, a second terminal of the switch 1204 corresponds to the other of the source and the drain of the transistor 1214, and conduction or non-conduction between the first terminal and the second terminal of the switch 1204 (i.e., the on/off state of the transistor 1214) is selected by the control signal RD input to a gate of the transistor 1214.

One of a source and a drain of the transistor 1209 is electrically connected to one of a pair of electrodes of the capacitor 1208 and a gate of the transistor 1210. Here, the connection portion is referred to as a node M2. One of a source and a drain of the transistor 1210 is electrically connected to a line which can supply a low power supply potential (e.g., a ground potential line), and the other thereof is electrically connected to the first terminal of the switch 1203 (the one of the source and the drain of the transistor 1213). The second terminal of the switch 1203 (the other of the source and the drain of the transistor 1213) is electrically connected to the first terminal of the switch 1204 (the one of the source and the drain of the transistor 1214). The second terminal of the switch 1204 (the other of the source and the drain of the transistor 1214) is electrically connected to a line which can supply a power supply potential VDD. The second terminal of the switch 1203 (the other of the source and the drain of the transistor 1213), the first terminal of the switch 1204 (the one of the source and the drain of the transistor 1214), an input terminal of the logic element 1206, and one of a pair of electrodes of the capacitor 1207 are electrically connected to each other. Here, the connection portion is referred to as a node M1. The other of the pair of electrodes of the capacitor 1207 can be supplied with a constant potential. For example, the other of the pair of electrodes of the capacitor 1207 can be supplied with a low power supply potential (e.g., a ground potential) or a high power supply potential (e.g., VDD). The other of the pair of electrodes of the capacitor 1207 is electrically connected to the line which can supply a low power supply potential (e.g., a ground potential line). The other of the pair of electrodes of the capacitor 1208 can be supplied with a constant potential. For example, the other of the pair of electrodes of the capacitor 1208 can be supplied with the low power supply potential (e.g., a ground potential) or the high power supply potential (e.g., VDD). The other of the pair of electrodes of the capacitor 1208 is electrically connected to the line which can supply a low power supply potential (e.g., a ground potential line).

The capacitor 1207 and the capacitor 1208 are not necessarily provided as long as the parasitic capacitance of the transistor, the wiring, or the like is actively utilized.

A control signal WE is input to the gate of the transistor 1209. As for each of the switch 1203 and the switch 1204, a conduction state or a non-conduction state between the first terminal and the second terminal is selected by the control signal RD which is different from the control signal WE. When the first terminal and the second terminal of one of the switches are in the conduction state, the first terminal and the second terminal of the other of the switches are in the non-conduction state.

A signal corresponding to data retained in the circuit 1201 is input to the other of the source and the drain of the transistor 1209. FIG. 13 illustrates an example in which a signal output from the circuit 1201 is input to the other of the source and the drain of the transistor 1209. The logic value of a signal output from the second terminal of the switch 1203 (the other of the source and the drain of the transistor 1213) is inverted by the logic element 1206, and the inverted signal is input to the circuit 1201 through the circuit 1220.

In the example of FIG. 13, a signal output from the second terminal of the switch 1203 (the other of the source and the drain of the transistor 1213) is input to the circuit 1201 through the logic element 1206 and the circuit 1220; however, one embodiment of the present invention is not limited thereto. The signal output from the second terminal of the switch 1203 (the other of the source and the drain of the transistor 1213) may be input to the circuit 1201 without its logic value being inverted. For example, in the case where the circuit 1201 includes a node in which a signal obtained by inversion of the logic value of a signal input from the input terminal is retained, the signal output from the second terminal of the switch 1203 (the other of the source and the drain of the transistor 1213) can be input to the node.

In FIG. 13, the transistors included in the memory element 1200 except for the transistor 1209 can each be a transistor in which a channel is formed in a semiconductor other than an oxide semiconductor or in the substrate 1190. For example, the transistor can be a transistor whose channel is formed in a silicon film or a silicon substrate. Alternatively, all the transistors in the memory element 1200 may be a transistor in which a channel is formed in an oxide semiconductor. Further alternatively, in the memory element 1200, a transistor in which a channel is formed in an oxide semiconductor can be included besides the transistor 1209, and a transistor in which a channel is formed in a layer or the substrate 1190 including a semiconductor other than an oxide semiconductor can be used for the rest of the transistors.

As the circuit 1201 in FIG. 13, for example, a flip-flop circuit can be used. As the logic element 1206, for example, an inverter or a clocked inverter can be used.

In a period during which the memory element 1200 is not supplied with the power supply voltage, the semiconductor device of one embodiment of the present invention can retain data stored in the circuit 1201 by the capacitor 1208 which is provided in the circuit 1202.

The off-state current of a transistor in which a channel is formed in an oxide semiconductor is extremely small. For example, the off-state current of a transistor in which a channel is formed in an oxide semiconductor is significantly smaller than that of a transistor in which a channel is formed in silicon having crystallinity. Thus, when the transistor is used as the transistor 1209, a signal held in the capacitor 1208 is retained for a long time also in a period during which the power supply voltage is not supplied to the memory element 1200. The memory element 1200 can accordingly retain the stored content (data) also in a period during which the supply of the power supply voltage is stopped.

Since the memory element performs pre-charge operation with the switch 1203 and the switch 1204, the time required for the circuit 1201 to retain original data again after the supply of the power supply voltage is restarted can be shortened.

In the circuit 1202, a signal retained by the capacitor 1208 is input to the gate of the transistor 1210. Therefore, after supply of the power supply voltage to the memory element 1200 is restarted, the signal retained by the capacitor 1208 can be converted into the one corresponding to the state (the on state or the off state) of the transistor 1210 to be read from the circuit 1202. Consequently, an original signal can be accurately read even when a potential corresponding to the signal retained by the capacitor 1208 varies to some degree.

Here, the transistor 1209, the transistor 1210, and the capacitor 1208 correspond to the transistor 51, the transistor 52, and the capacitor 50 in FIG. 6A, respectively. Therefore, the structures illustrated in FIG. 6B, FIG. 7, FIG. 8A, FIG. 8B, FIG. 9A, FIG. 9B, FIG. 10A, or FIG. 10B can be employed for the transistor 1209, the transistor 1210, and the capacitor 1208. Alternatively, the description of the transistor 51, the transistor 52, and the capacitor 50 may be referred to for the transistor 1209, the transistor 1210, and the capacitor 1208.

By applying the above-described memory element 1200 to a memory device such as a register or a cache memory included in a processor, data in the memory device can be prevented from being lost owing to the stop of the supply of the power supply voltage. Furthermore, shortly after the supply of the power supply voltage is restarted, the memory device can be returned to the same state as that before the power supply is stopped. Therefore, the power supply can be stopped even for a short time in the processor or one or a plurality of logic circuits included in the processor, resulting in lower power consumption.

Although the memory element 1200 is used in a CPU, the memory element 1200 can also be used in an LSI such as a digital signal processor (DSP), a custom LSI, or a programmable logic device (PLD), and a radio frequency identification (RF-ID).

<RF Tag>

An RF tag including the transistor or the memory device is described below with reference to FIG. 14.

The RF tag of one embodiment of the present invention includes a memory circuit, stores data in the memory circuit, and transmits and receives data to/from the outside by using contactless means, for example, wireless communication. With these features, the RF tag can be used for an individual authentication system in which an object or the like is recognized by reading the individual information, for example. Note that the RF tag is required to have high reliability in order to be used for this purpose.

A configuration of the RF tag will be described with reference to FIG. 14. FIG. 14 is a block diagram illustrating a configuration example of an RF tag.

Figure 14:
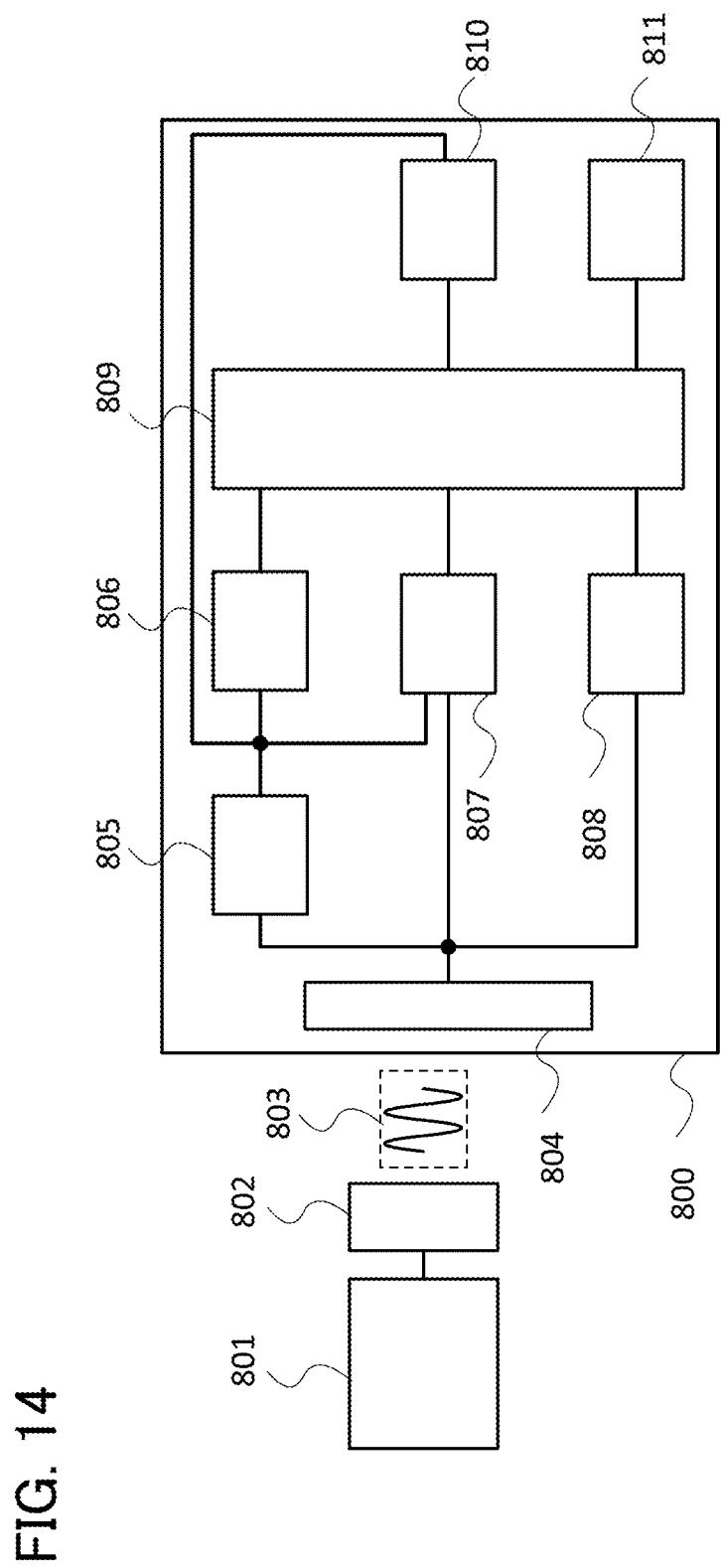
FIG. 14 is a block diagram of an RF tag of one embodiment of the present invention.
Figure 15A:
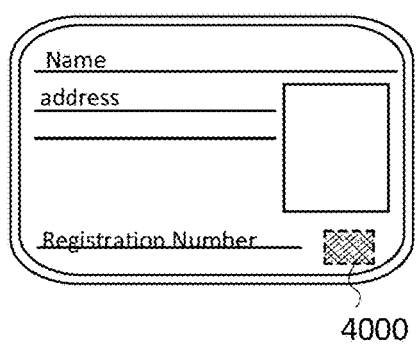
FIGS. 15A to 15F show application examples of an RF tag of one embodiment of the present invention.
Figure 15B:
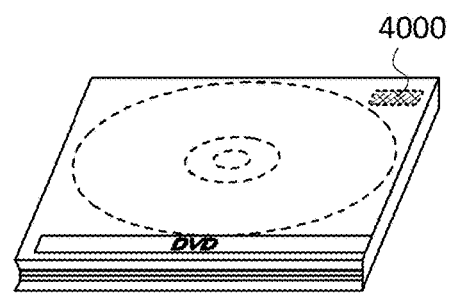
Figure 15C:
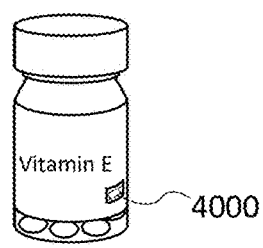
Figure 15D:
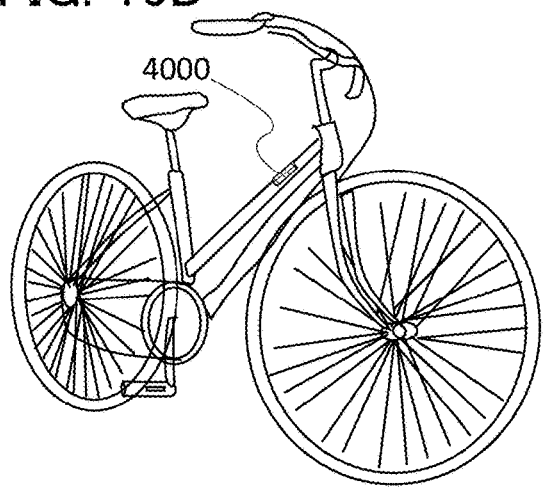
Figure 15E:
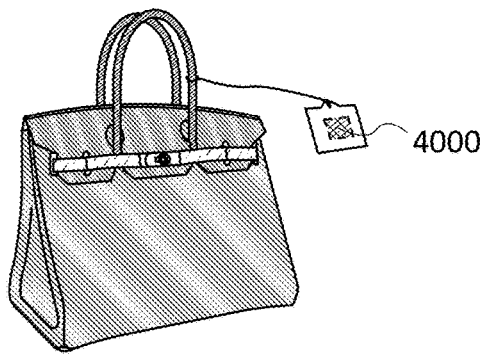
Figure 15F:
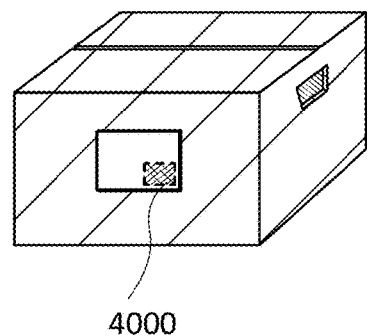

As shown in FIG. 14, an RF tag 800 includes an antenna 804 which receives a radio signal 803 that is transmitted from an antenna 802 connected to a communication device 801 (also referred to as an interrogator, a reader/writer, or the like). The RF tag 800 includes a rectifier circuit 805, a constant voltage circuit 806, a demodulation circuit 807, a modulation circuit 808, a logic circuit 809, a memory circuit 810, and a ROM 811. A semiconductor of a transistor having a rectifying function included in the demodulation circuit 807 may be a material which enables a reverse current to be low enough, for example, an oxide semiconductor. This can suppress the phenomenon of a rectifying function becoming weaker due to generation of a reverse current and prevent saturation of the output from the demodulation circuit. In other words, the input to the demodulation circuit and the output from the demodulation circuit can have a relation closer to a linear relation. Note that data transmission methods are roughly classified into the following three methods: an electromagnetic coupling method in which a pair of coils is provided so as to face each other and communicates with each other by mutual induction, an electromagnetic induction method in which communication is performed using an induction field, and a radio wave method in which communication is performed using a radio wave. Any of these methods can be used in the RF tag 800.

Next, the structure of each circuit will be described. The antenna 804 exchanges the radio signal 803 with the antenna 802 which is connected to the communication device 801. The rectifier circuit 805 generates an input potential by rectification, for example, half-wave voltage doubler rectification of an input alternating signal generated by reception of a radio signal at the antenna 804 and smoothing of the rectified signal with a capacitor provided in a later stage in the rectifier circuit 805. Note that a limiter circuit may be provided on an input side or an output side of the rectifier circuit 805. The limiter circuit controls electric power so that electric power which is higher than or equal to certain electric power is not input to a circuit in a later stage if the amplitude of the input alternating signal is high and an internal generation voltage is high.

The constant voltage circuit 806 generates a stable power supply voltage from an input potential and supplies it to each circuit. Note that the constant voltage circuit 806 may include a reset signal generation circuit. The reset signal generation circuit is a circuit which generates a reset signal of the logic circuit 809 by utilizing rise of the stable power supply voltage.

The demodulation circuit 807 demodulates the input alternating signal by envelope detection and generates the demodulated signal. Furthermore, the modulation circuit 808 performs modulation in accordance with data to be output from the antenna 804.

The logic circuit 809 analyzes and processes the demodulated signal. The memory circuit 810 holds the input data and includes a row decoder, a column decoder, a memory region, and the like. Furthermore, the ROM 811 stores an identification number (ID) or the like and outputs it in accordance with processing.

Note that the decision whether each circuit described above is provided or not can be made as appropriate.

Here, the above-described memory device can be used as the memory circuit 810. Since the memory device of one embodiment of the present invention can retain data even when not powered, the memory device is suitable for an RF tag. Furthermore, the memory device of one embodiment of the present invention needs power (voltage) needed for data writing lower than that needed in a conventional nonvolatile memory; thus, it is possible to prevent a difference between the maximum communication range in data reading and that in data writing. In addition, it is possible to suppress malfunction or incorrect writing which is caused by power shortage in data writing.

Since the memory device of one embodiment of the present invention can be used as a nonvolatile memory, it can also be used as the ROM 811. In this case, it is preferable that a manufacturer separately prepare a command for writing data to the ROM 811 so that a user cannot rewrite data freely. Since the manufacturer gives identification numbers before shipment and then starts shipment of products, instead of putting identification numbers to all the manufactured RF tags, it is possible to put identification numbers to only good products to be shipped. Thus, the identification numbers of the shipped products are in series and customer management corresponding to the shipped products is easily performed.

<Application Examples of RF Tag>

Application examples of the RF tag of one embodiment of the present invention are shown below with reference to FIGS. 15A to 15F. The RF tag is widely used and can be provided for, for example, products such as bills, coins, securities, bearer bonds, documents (e.g., driver's licenses or resident's cards, see FIG. 15A), packaging containers (e.g., wrapping paper or bottles, see FIG. 15C), recording media (e.g., DVDs or video tapes, see FIG. 15B), vehicles (e.g., bicycles, see FIG. 15D), personal belongings (e.g., bags or glasses), foods, plants, animals, human bodies, clothing, household goods, medical supplies such as medicine and chemicals, and electronic devices (e.g., liquid crystal display devices, EL display devices, television sets, or cellular phones), or tags on products (see FIGS. 15E and 15F).

An RF tag 4000 of one embodiment of the present invention is fixed to products by being attached to a surface thereof or embedded therein. For example, the RF tag 4000 is fixed to each product by being embedded in paper of a book, or embedded in an organic resin of a package. The RF tag 4000 of one embodiment of the present invention is small, thin, and lightweight, so that the design of a product is not impaired even after the RF tag 4000 of one embodiment of the present invention is fixed thereto. Furthermore, bills, coins, securities, bearer bonds, documents, or the like can have identification functions by being provided with the RF tag 4000 of one embodiment of the present invention, and the identification functions can be utilized to prevent counterfeits. Moreover, the efficiency of a system such as an inspection system can be improved by providing the RF tag 4000 of one embodiment of the present invention for packaging containers, recording media, personal belongings, foods, clothing, household goods, electronic devices, or the like. Vehicles can also have higher security against theft or the like by being provided with the RF tag 4000 of one embodiment of the present invention.

As described above, the RF tag of one embodiment of the present invention can be used for the above-described purposes.

<Display Device>

The following shows configuration examples of a display device of one embodiment of the present invention.

[Configuration Example]

Figure 16A:
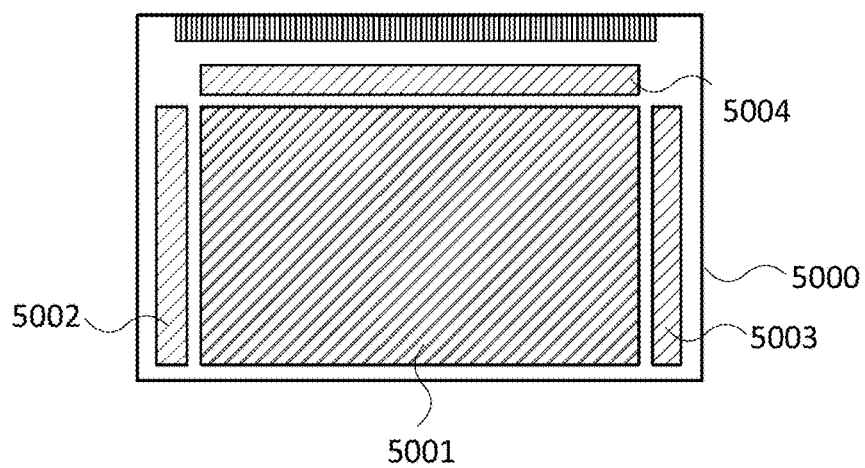
FIGS. 16A to 16C are a top view and circuit diagrams of a display device of one embodiment of the present invention.
Figure 16B:
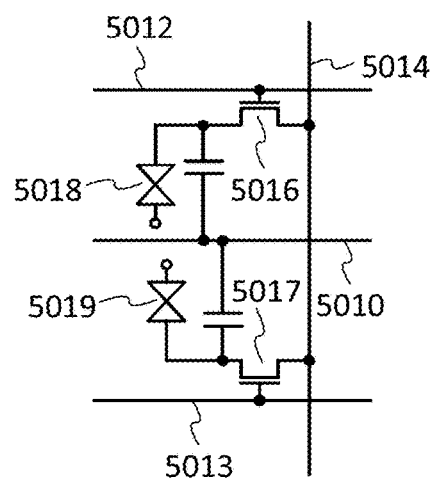
Figure 16C:
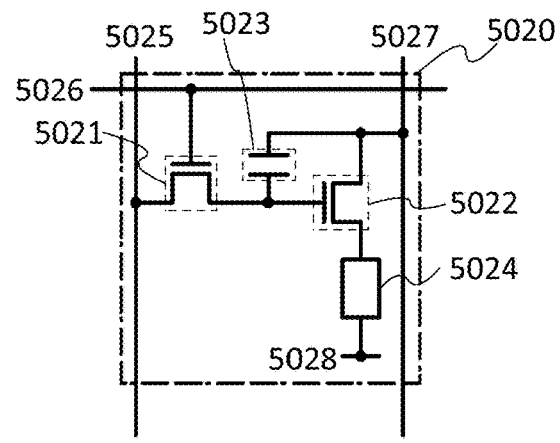

FIG. 16A is a top view of a display device of one embodiment of the present invention. FIG. 16B illustrates a pixel circuit where a liquid crystal element is used for a pixel of a display device of one embodiment of the present invention. FIG. 16C illustrates a pixel circuit where an organic EL element is used for a pixel of a display device of one embodiment of the present invention.

Any of the above-described transistors and/or the capacitors can be used as a transistor and/or a capacitor used for the pixel. Here, an example in which an n-channel transistor is used is shown. Note that a transistor manufactured through the same steps as the transistor used for the pixel may be used for a driver circuit. Thus, by using any of the above-described transistors for a pixel or a driver circuit, the display device can have high display quality and/or high reliability.

FIG. 16A illustrates an example of a top view of an active matrix display device. A pixel portion 5001, a first scan line driver circuit 5002, a second scan line driver circuit 5003, and a signal line driver circuit 5004 are provided over a substrate 5000 in the display device. The pixel portion 5001 is electrically connected to the signal line driver circuit 5004 through a plurality of signal lines and is electrically connected to the first scan line driver circuit 5002 and the second scan line driver circuit 5003 through a plurality of scan lines. Pixels including display elements are provided in respective regions divided by the scan lines and the signal lines. The substrate 5000 of the display device is electrically connected to a timing control circuit (also referred to as a controller or a control IC) through a connection portion such as a flexible printed circuit (FPC).

The first scan line driver circuit 5002, the second scan line driver circuit 5003, and the signal line driver circuit 5004 are formed over the substrate 5000 where the pixel portion 5001 is formed. Therefore, a display device can be manufactured at cost lower than that in the case where a driver circuit is separately formed. Furthermore, in the case where a driver circuit is separately formed, the number of wiring connections is increased. By providing the driver circuit over the substrate 5000, the number of wiring connections can be reduced. Accordingly, the reliability and/or yield can be improved.

[Liquid Crystal Display Device]

FIG. 16B illustrates an example of a circuit configuration of the pixel. Here, a pixel circuit which is applicable to a pixel of a VA liquid crystal display device, or the like is illustrated.

This pixel circuit can be applied to a structure in which one pixel includes a plurality of pixel electrodes. The pixel electrodes are connected to different transistors, and the transistors can be driven with different gate signals. Accordingly, signals applied to individual pixel electrodes in a multi-domain pixel can be controlled independently.

A gate wiring 5012 of a transistor 5016 and a gate wiring 5013 of a transistor 5017 are separated so that different gate signals can be supplied thereto. In contrast, a source or drain electrode 5014 functioning as a data line is shared by the transistors 5016 and 5017. Any of the above-described transistors can be used as appropriate as each of the transistors 5016 and 5017. Thus, a liquid crystal display device having high display quality and/or high reliability can be provided.

The shapes of a first pixel electrode electrically connected to the transistor 5016 and a second pixel electrode electrically connected to the transistor 5017 are described. The first pixel electrode and the second pixel electrode are separated by a slit. The first pixel electrode has a V shape and the second pixel electrode is provided so as to surround the first pixel electrode.

A gate electrode of the transistor 5016 is electrically connected to the gate wiring 5012, and a gate electrode of the transistor 5017 is electrically connected to the gate wiring 5013. When different gate signals are supplied to the gate wiring 5012 and the gate wiring 5013, operation timings of the transistor 5016 and the transistor 5017 can be varied. As a result, alignment of liquid crystals can be controlled.

Furthermore, a capacitor may be formed using a capacitor wiring 5010, a gate insulating film functioning as a dielectric, and a capacitor electrode electrically connected to the first pixel electrode or the second pixel electrode.

The multi-domain pixel includes a first liquid crystal element 5018 and a second liquid crystal element 5019. The first liquid crystal element 5018 includes the first pixel electrode, a counter electrode, and a liquid crystal layer therebetween. The second liquid crystal element 5019 includes the second pixel electrode, a counter electrode, and a liquid crystal layer therebetween.

Note that a pixel circuit in the display device of one embodiment of the present invention is not limited to that shown in FIG. 16B. For example, a switch, a resistor, a capacitor, a transistor, a sensor, a logic circuit, or the like may be added to the pixel circuit shown in FIG. 16B.

[Organic EL Display Device]

FIG. 16C illustrates another example of a circuit configuration of the pixel. Here, a pixel structure of a display device using an organic EL element is shown.

In an organic EL element, by application of voltage to a light-emitting element, electrons are injected from one of a pair of electrodes included in the organic EL element and holes are injected from the other of the pair of electrodes, into a layer containing a light-emitting organic compound; thus, current flows. The electrons and holes are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

FIG. 16C illustrates an example of a pixel circuit. Here, one pixel includes two n-channel transistors. Note that any of the above-described transistors can be used as the n-channel transistors. Furthermore, digital time grayscale driving can be employed for the pixel circuit.

The configuration of the applicable pixel circuit and operation of a pixel employing digital time grayscale driving will be described.

A pixel 5020 includes a switching transistor 5021, a driver transistor 5022, a light-emitting element 5024, and a capacitor 5023. A gate electrode of the switching transistor 5021 is connected to a scan line 5026, a first electrode (one of a source electrode and a drain electrode) of the switching transistor 5021 is connected to a signal line 5025, and a second electrode (the other of the source electrode and the drain electrode) of the switching transistor 5021 is connected to a gate electrode of the driver transistor 5022. The gate electrode of the driver transistor 5022 is connected to a power supply line 5027 through the capacitor 5023, a first electrode of the driver transistor 5022 is connected to the power supply line 5027, and a second electrode of the driver transistor 5022 is connected to a first electrode (a pixel electrode) of the light-emitting element 5024. A second electrode of the light-emitting element 5024 corresponds to a common electrode 5028. The common electrode 5028 is electrically connected to a common potential line provided over the same substrate.

As each of the switching transistor 5021 and the driver transistor 5022, any of the above-described transistors can be used as appropriate. In this manner, an organic EL display device having high display quality and/or high reliability can be provided.

The potential of the second electrode (the common electrode 5028) of the light-emitting element 5024 is set to be a low power supply potential. Note that the low power supply potential is lower than a high power supply potential supplied to the power supply line 5027. For example, the low power supply potential can be GND, 0 V, or the like. The high power supply potential and the low power supply potential are set to be higher than or equal to the forward threshold voltage of the light-emitting element 5024, and the difference between the potentials is applied to the light-emitting element 5024, whereby current is supplied to the light-emitting element 5024, leading to light emission. The forward voltage of the light-emitting element 5024 refers to a voltage at which a desired luminance is obtained, and includes at least forward threshold voltage.

Note that gate capacitance of the driver transistor 5022 may be used as a substitute for the capacitor 5023 in some cases, so that the capacitor 5023 can be omitted. The gate capacitance of the driver transistor 5022 may be formed between the channel formation region and the gate electrode.

Next, a signal input to the driver transistor 5022 is described. In the case of a voltage-input voltage driving method, a video signal for turning on or off the driver transistor 5022 is input to the driver transistor 5022. In order for the driver transistor 5022 to operate in a linear region, voltage higher than the voltage of the power supply line 5027 is applied to the gate electrode of the driver transistor 5022. Note that voltage higher than or equal to voltage which is the sum of power supply line voltage and the threshold voltage $V_{th}$ of the driver transistor 5022 is applied to the signal line 5025.

In the case of performing analog grayscale driving, a voltage higher than or equal to a voltage which is the sum of the forward voltage of the light-emitting element 5024 and the threshold voltage $V_{th}$ of the driver transistor 5022 is applied to the gate electrode of the driver transistor 5022. A video signal by which the driver transistor 5022 is operated in a saturation region is input, so that current is supplied to the light-emitting element 5024. In order for the driver transistor 5022 to operate in a saturation region, the potential of the power supply line 5027 is set higher than the gate potential of the driver transistor 5022. When an analog video signal is used, it is possible to supply current to the light-emitting element 5024 in accordance with the video signal and perform analog grayscale driving.

Note that in the display device of one embodiment of the present invention, a pixel configuration is not limited to that shown in FIG. 16C. For example, a switch, a resistor, a capacitor, a sensor, a transistor, a logic circuit, or the like may be added to the pixel circuit shown in FIG. 16C.

In the case where any of the above-described transistors is used for the circuit shown in FIGS. 16A to 16C, the source electrode (the first electrode) is electrically connected to the low potential side and the drain electrode (the second electrode) is electrically connected to the high potential side. Furthermore, the potential of the first gate electrode may be controlled by a control circuit or the like and the potential described above as an example, e.g., a potential lower than the potential applied to the source electrode, may be input to the second gate electrode.

For example, in this specification and the like, a display element, a display device which is a device including a display element, a light-emitting element, and a light-emitting device which is a device including a light-emitting element can employ a variety of modes or can include a variety of elements. Examples of a display element, a display device, a light-emitting element, or a light-emitting device include an EL element (e.g., an EL element including organic and inorganic materials, an organic EL element, or an inorganic EL element), an LED (e.g., a white LED, a red LED, a green LED, or a blue LED), a transistor (a transistor which emits light depending on current), an electron emitter, a liquid crystal element, electronic ink, an electrophoretic element, a grating light valve (GLV), a plasma display panel (PDP), a micro electro mechanical system (MEMS), a digital micromirror device (DMD), a digital micro shutter (DMS), an interferometric modulator display (IMOD) element, an electrowetting element, a piezoelectric ceramic display, or a carbon nanotube, which are display media whose contrast, luminance, reflectivity, transmittance, or the like is changed by electromagnetic action. Note that examples of display devices having EL elements include an EL display. Examples of a display device including an electron emitter include a field emission display (FED), an SED-type flat panel display (SED: surface-conduction electron-emitter display), and the like. Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Display devices having electronic ink or electrophoretic elements include electronic paper and the like.

<Module>

A display module using a semiconductor device of one embodiment of the present invention is described below with reference to FIG. 17.

Figure 17:
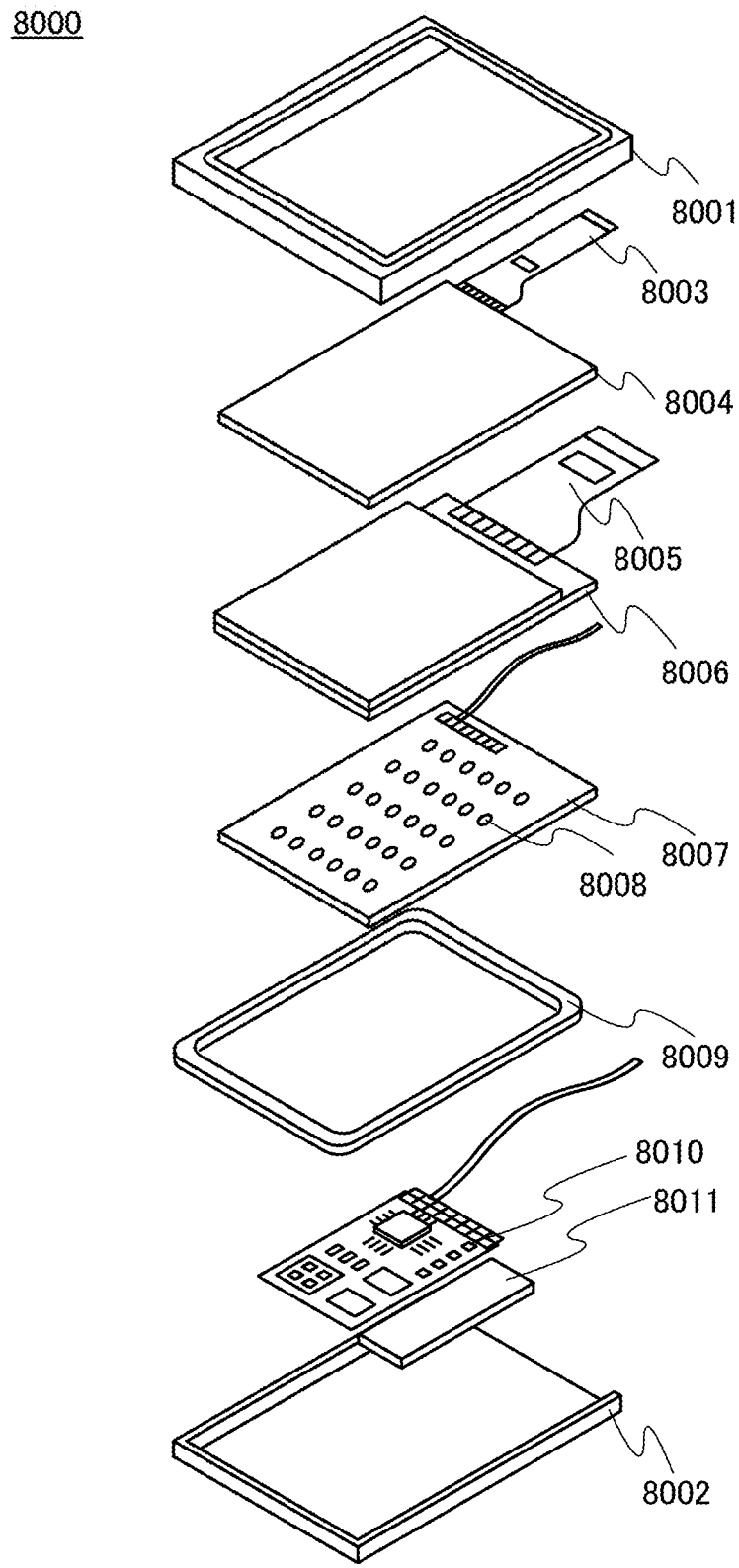
FIG. 17 illustrates a display module.

In a display module 8000 in FIG. 17, a touch panel 8004 connected to an FPC 8003, a cell 8006 connected to an FPC 8005, a backlight unit 8007, a frame 8009, a printed board 8010, and a battery 8011 are provided between an upper cover 8001 and a lower cover 8002. Note that the backlight unit 8007, the battery 8011, the touch panel 8004, and the like are not provided in some cases.

The semiconductor device of one embodiment of the present invention can be used for the cell 8006, for example.

The shapes and sizes of the upper cover 8001 and the lower cover 8002 can be changed as appropriate in accordance with the sizes of the touch panel 8004 and the cell 8006.

The touch panel 8004 can be a resistive touch panel or a capacitive touch panel and may be formed to overlap with the cell 8006. A counter substrate (sealing substrate) of the cell 8006 can have a touch panel function. A photosensor may be provided in each pixel of the cell 8006 so that an optical touch panel is obtained. An electrode for a touch sensor may be provided in each pixel of the cell 8006 so that a capacitive touch panel is obtained.

The backlight unit 8007 includes a light source 8008. The light source 8008 may be provided at an end portion of the backlight unit 8007 and a light diffusing plate may be used.

The frame 8009 may protect the cell 8006 and also function as an electromagnetic shield for blocking electromagnetic waves generated by the operation of the printed board 8010. The frame 8009 may function as a radiator plate.

The printed board 8010 has a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 can be additionally provided with a member such as a polarizing plate, a retardation plate, or a prism sheet <Electronic Device>

The semiconductor device of one embodiment of the present invention can be used for display devices, personal computers, or image reproducing devices provided with recording media (typically, devices which reproduce the content of recording media such as digital versatile discs (DVDs) and have displays for displaying the reproduced images). Other examples of electronic devices that can be equipped with the semiconductor device of one embodiment of the present invention are mobile phones, game machines including portable game consoles, portable data terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 18A to 18F illustrate specific examples of these electronic devices.

Figure 18A:
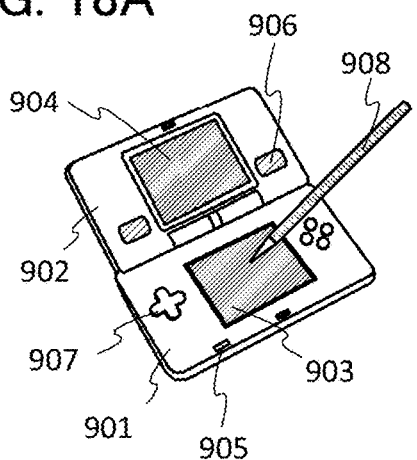
FIGS. 18A to 18F are views each illustrating an electronic device of one embodiment of the present invention.

FIG. 18A illustrates a portable game console including a housing 901, a housing 902, a display portion 903, a display portion 904, a microphone 905, a speaker 906, an operation key 907, a stylus 908, and the like. Although the portable game console in FIG. 18A has the two display portions 903 and 904, the number of display portions included in a portable game console is not limited to this.

Figure 18B:
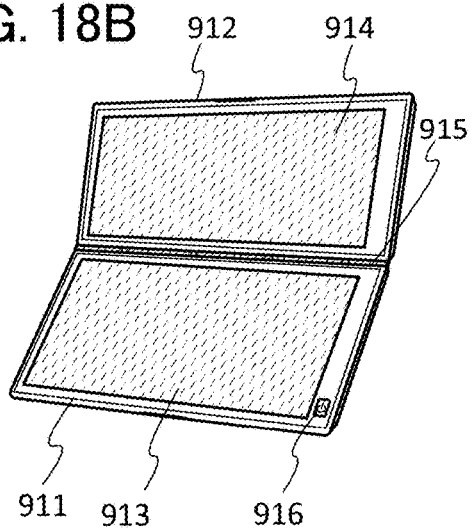

FIG. 18B illustrates a portable data terminal including a first housing 911, a second housing 912, a first display portion 913, a second display portion 914, a joint 915, an operation key 916, and the like. The first display portion 913 is provided in the first housing 911, and the second display portion 914 is provided in the second housing 912. The first housing 911 and the second housing 912 are connected to each other with the joint 915, and the angle between the first housing 911 and the second housing 912 can be changed with the joint 915. An image on the first display portion 913 may be switched depending on the angle between the first housing 911 and the second housing 912 at the joint 915. A display device with a position input function may be used as at least one of the first display portion 913 and the second display portion 914. Note that the position input function can be added by providing a touch panel in a display device. Alternatively, the position input function can be added by provision of a photoelectric conversion element called a photosensor in a pixel portion of a display device.

Figure 18C:
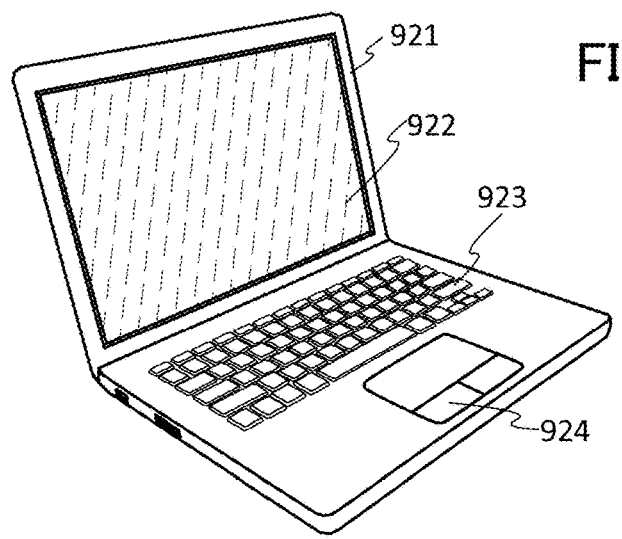

FIG. 18C illustrates a laptop personal computer including a housing 921, a display portion 922, a keyboard 923, a pointing device 924, and the like.

Figure 18D:
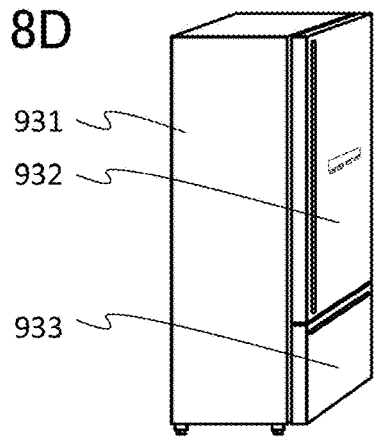

FIG. 18D illustrates an electric refrigerator-freezer including a housing 931, a door for a refrigerator 932, a door for a freezer 933, and the like.

Figure 18E:
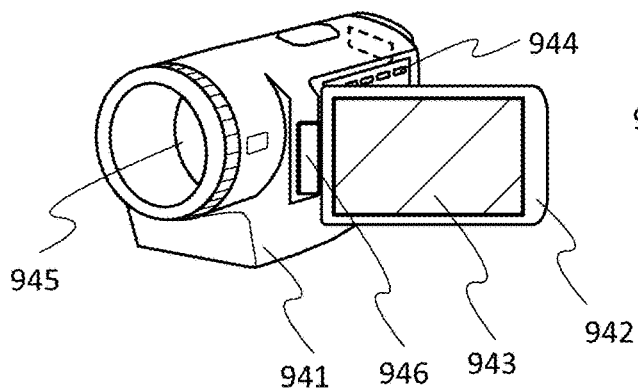

FIG. 18E illustrates a video camera including a first housing 941, a second housing 942, a display portion 943, operation keys 944, a lens 945, a joint 946, and the like. The operation keys 944 and the lens 945 are provided for the first housing 941, and the display portion 943 is provided for the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle between the first housing 941 and the second housing 942 at the joint 946.

Figure 18F:
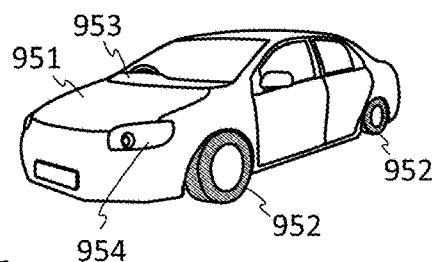

FIG. 18F illustrates an ordinary vehicle including a car body 951, wheels 952, a dashboard 953, lights 954, and the like.

This application is based on Japanese Patent Application serial no. 2013-196335 filed with Japan Patent Office on Sep. 23, 2013, the entire contents of which are hereby incorporated by reference.

What is claimed is:

1. A semiconductor device comprising:
a semiconductor;
a first conductive film and a second conductive film each comprising a region in contact with a top surface and a side surface of the semiconductor;
a first insulating film comprising a region in contact with the top surface and the side surface of the semiconductor;
a third conductive film comprising a region facing the top surface and the side surface of the semiconductor with the first insulating film between the third conductive film and the semiconductor;
a second insulating film which is in contact with the first conductive film and comprises an opening reaching the first conductive film;
a fourth conductive film comprising a first region facing the first conductive film and a second region in contact with a side surface of the opening;
a third insulating film comprising a region facing the first region and the side surface of the opening with the fourth conductive film between the third insulating film and the side surface of the opening; and
a fifth conductive film comprising a region facing the fourth conductive film with the third insulating film between the fifth conductive film and the fourth conductive film;
wherein a part of a top surface of the fourth conductive film is located below a bottom surface of the semiconductor.

2. The semiconductor device according to claim 1, wherein the semiconductor is a multilayer film comprising a first oxide semiconductor layer and a second oxide semiconductor layer having a higher electron affinity than the first oxide semiconductor layer.

3. The semiconductor device according to claim 2, further comprising a third oxide semiconductor layer having a lower electron affinity than the second oxide semiconductor layer between the semiconductor and the first insulating film.

4. The semiconductor device according to claim 1, wherein a part of a top surface of the first conductive film is located below the bottom surface of the semiconductor.

5. The semiconductor device according to claim 1, wherein a part of a bottom surface of the third conductive film is located below the bottom surface of the semiconductor.

6. The semiconductor device according to claim 1,
wherein a part of a top surface of the first conductive film is located below the bottom surface of the semiconductor,
wherein the part of the top surface of the fourth conductive film is located below the bottom surface of the semiconductor, and
wherein a part of a bottom surface of the third conductive film is located below the bottom surface of the semiconductor.

7. A semiconductor device comprising:
a first transistor;
a second transistor; and
a capacitor,
wherein the second transistor comprises:
a semiconductor;
a first conductive film and a second conductive film each comprising a region in contact with a top surface and a side surface of the semiconductor;
a first insulating film comprising a region in contact with the top surface and the side surface of the semiconductor; and
a third conductive film comprising a region facing the top surface and the side surface of the semiconductor with the first insulating film between the third conductive film and the semiconductor, and
wherein the capacitor comprises:
a second insulating film which is in contact with the first conductive film and comprises an opening reaching the first conductive film;
a fourth conductive film comprising a first region facing the first conductive film and a second region in contact with a side surface of the opening;
a third insulating film comprising a region facing the first region and the side surface of the opening with the fourth conductive film between the third insulating film and the side surface of the opening; and
a fifth conductive film comprising a region facing the fourth conductive film with the third insulating film between the fifth conductive film and the fourth conductive film;

wherein a part of a top surface of the fourth conductive film is located below a bottom surface of the semiconductor.

8. The semiconductor device according to claim 7, wherein the semiconductor is a multilayer film comprising a first oxide semiconductor layer and a second oxide semiconductor layer having a higher electron affinity than the first oxide semiconductor layer.

9. The semiconductor device according to claim 8, further comprising a third oxide semiconductor layer having a lower electron affinity than the second oxide semiconductor layer between the semiconductor and the first insulating film.

10. The semiconductor device according to claim 7, further comprising a semiconductor substrate,
wherein the first transistor uses the semiconductor substrate, and
wherein the second transistor overlaps with at least part of the first transistor.

11. The semiconductor device according to claim 7, wherein the first transistor is electrically connected to the second transistor.

12. The semiconductor device according to claim 7, wherein a part of a top surface of the first conductive film is located below the bottom surface of the semiconductor.

13. The semiconductor device according to claim 7, wherein a part of a bottom surface of the third conductive film is located below the bottom surface of the semiconductor.

14. The semiconductor device according to claim 7,
wherein a part of a top surface of the first conductive film is located below the bottom surface of the semiconductor,
wherein the part of the top surface of the fourth conductive film is located below the bottom surface of the semiconductor, and
wherein a part of a bottom surface of the third conductive film is located below the bottom surface of the semiconductor.

15. A semiconductor device comprising:
a semiconductor;
a first conductive film and a second conductive film each comprising a region in contact with a top surface and a side surface of the semiconductor arranged in a channel length direction;
a first insulating film comprising a region in contact with the top surface and the side surface of the semiconductor in a channel width direction;
a third conductive film comprising a region facing the top surface and the side surface of the semiconductor with the first insulating film between the third conductive film and the semiconductor;
a second insulating film which is in contact with the first conductive film and comprises an opening reaching the first conductive film;
a fourth conductive film comprising a first region facing the first conductive film and a second region in contact with a side surface of the opening;
a third insulating film comprising a region facing the first region and the side surface of the opening with the fourth conductive film between the third insulating film and the side surface of the opening; and
a fifth conductive film comprising a region facing the fourth conductive film with the third insulating film between the fifth conductive film and the fourth conductive film;

wherein in the channel width direction a part of a bottom surface of the third conductive film is located below a bottom surface of the semiconductor,
wherein the channel length direction is a direction from the first conductive film to the second conductive film, and
wherein the channel width direction is a direction perpendicular to the channel length direction and parallel to the top surface of the semiconductor at half-distance between the first conductive film and the second conductive film.

16. The semiconductor device according to claim 15, wherein the semiconductor is a multilayer film comprising a first oxide semiconductor layer and a second oxide semiconductor layer having a higher electron affinity than the first oxide semiconductor layer.

17. The semiconductor device according to claim 16, further comprising a third oxide semiconductor layer having a lower electron affinity than the second oxide semiconductor layer between the semiconductor and the first insulating film.

18. The semiconductor device according to claim 15, wherein a part of a top surface of the first conductive film is located below the bottom surface of the semiconductor.

19. The semiconductor device according to claim 15, wherein a part of a top surface of the fourth conductive film is located below the bottom surface of the semiconductor.

20. The semiconductor device according to claim 15,
wherein a part of a top surface of the first conductive film is located below the bottom surface of the semiconductor, and
wherein a part of a top surface of the fourth conductive film is located below the bottom surface of the semiconductor.

21. A semiconductor device comprising:
a first transistor;
a second transistor; and
a capacitor,
wherein the second transistor comprises:
a semiconductor;
a first conductive film and a second conductive film each comprising a region in contact with a top surface and a side surface of the semiconductor arranged in a channel length direction;
a first insulating film comprising a region in contact with the top surface and the side surface of the semiconductor in a channel width direction; and
a third conductive film comprising a region facing the top surface and the side surface of the semiconductor with the first insulating film between the third conductive film and the semiconductor, and
wherein the capacitor comprises:
a second insulating film which is in contact with the first conductive film and comprises an opening reaching the first conductive film;
a fourth conductive film comprising a first region facing the first conductive film and a second region in contact with a side surface of the opening;
a third insulating film comprising a region facing the first region and the side surface of the opening with the fourth conductive film between the third insulating film and the side surface of the opening; and
a fifth conductive film comprising a region facing the fourth conductive film with the third insulating film between the fifth conductive film and the fourth conductive film;

wherein in the channel width direction a part of a bottom surface of the third conductive film is located below a bottom surface of the semiconductor, wherein the channel length direction is a direction from the first conductive film to the second conductive film, and wherein the channel width direction is a direction perpendicular to the channel length direction and parallel to the top surface of the semiconductor at half-distance between the first conductive film and the second conductive film.

22. The semiconductor device according to claim 21, wherein the semiconductor is a multilayer film comprising a first oxide semiconductor layer and a second oxide semiconductor layer having a higher electron affinity than the first oxide semiconductor layer.

23. The semiconductor device according to claim 22, further comprising a third oxide semiconductor layer having a lower electron affinity than the second oxide semiconductor layer between the semiconductor and the first insulating film.

24. The semiconductor device according to claim 21, further comprising a semiconductor substrate, wherein the first transistor uses the semiconductor substrate, and wherein the second transistor overlaps with at least part of the first transistor.

25. The semiconductor device according to claim 21, wherein the first transistor is electrically connected to the second transistor.

26. The semiconductor device according to claim 21, wherein a part of a top surface of the first conductive film is located below the bottom surface of the semiconductor.

27. The semiconductor device according to claim 21, wherein a part of a top surface of the fourth conductive film is located below the bottom surface of the semiconductor.

28. The semiconductor device according to claim 21, wherein a part of a top surface of the first conductive film is located below the bottom surface of the semiconductor, and wherein a part of a top surface of the fourth conductive film is located below the bottom surface of the semiconductor.

* * * * *